United States Patent
Bernardon

(10) Patent No.: US 9,941,789 B2
(45) Date of Patent: Apr. 10, 2018

(54) FEEDFORWARD CIRCUIT FOR DC-TO-DC CONVERTERS WITH DIGITAL VOLTAGE CONTROL LOOP

(71) Applicant: Infineon Technologies AG, Neubiberg (DE)

(72) Inventor: Derek Bernardon, Villach (AT)

(73) Assignee: Infineon Technologies AG, Neubiberg (DE)

( * ) Notice: Subject to any disclaimer, the term of this patent is extended or adjusted under 35 U.S.C. 154(b) by 25 days.

(21) Appl. No.: 14/930,359

(22) Filed: Nov. 2, 2015

(65) Prior Publication Data

US 2017/0126119 A1    May 4, 2017

(51) Int. Cl.
| | | |
|---|---|---|
| *H02M 3/157* | (2006.01) | |
| *H02M 1/08* | (2006.01) | |
| *H03K 7/08* | (2006.01) | |

(52) U.S. Cl.
CPC ............. *H02M 3/157* (2013.01); *H02M 1/08* (2013.01); *H03K 7/08* (2013.01)

(58) Field of Classification Search
CPC ........... H02M 2001/0012; H02M 1/08; H02M 1/081; H02M 1/082; H02M 3/15; H02M 3/156; H02M 3/157; H03K 7/08
USPC .................................. 323/234, 265, 282, 283
See application file for complete search history.

(56) References Cited

U.S. PATENT DOCUMENTS

| | | | | |
|---|---|---|---|---|
| 7,622,820 B1* | 11/2009 | Prodic | .................. | H02M 3/158 307/31 |
| 2006/0227861 A1* | 10/2006 | Maksimovic | ....... | H02M 3/1588 375/238 |
| 2008/0310201 A1* | 12/2008 | Maksimovic | ....... | H02M 3/1584 363/85 |
| 2009/0195231 A1* | 8/2009 | Noon | .................... | H02M 3/156 323/282 |
| 2010/0207594 A1* | 8/2010 | Davoudi | ............... | H02M 3/157 323/283 |
| 2010/0237838 A1* | 9/2010 | Templeton | ............ | H02M 3/157 323/271 |
| 2012/0153917 A1* | 6/2012 | Adell | .................. | H02M 3/1588 323/283 |
| 2013/0003420 A1* | 1/2013 | Ye | ..................... | H02M 3/33515 363/17 |
| 2013/0187691 A1* | 7/2013 | Sreekiran | ............... | H03H 11/04 327/157 |

(Continued)

OTHER PUBLICATIONS

Park et al., "A VCO-based Analog-to-Digital Converter with Second-Order Sigma-Delta Noise SHaping", 2009, IEEE, pp. 3130-3133.*

(Continued)

*Primary Examiner* — Jeffrey Gblende
*Assistant Examiner* — David A. Singh
(74) *Attorney, Agent, or Firm* — Shumaker & Sieffert, P.A.

(57) ABSTRACT

A method may comprise receiving a first clock signal; receiving a digital duty cycle value; using the first clock signal and digital duty cycle value to generate a digital pulse width modulation (DPWM) signal having a plurality of discrete steps to control a switch of a switched-mode power supply; and using a voltage control circuit to modify a duration of each of the plurality of discrete steps of the DPWM signal, wherein the voltage control circuit is configured to receive an analog voltage input.

22 Claims, 13 Drawing Sheets

(56) References Cited

U.S. PATENT DOCUMENTS

| | | | | |
|---|---|---|---|---|
| 2013/0241514 A1* | 9/2013 | Molaro | ............ | H02M 7/53873 |
| | | | | 323/283 |
| 2014/0097808 A1* | 4/2014 | Clark | ........................ | G05F 1/70 |
| | | | | 323/208 |
| 2014/0327413 A1* | 11/2014 | Hou | ...................... | H02M 3/157 |
| | | | | 323/234 |
| 2015/0188417 A1* | 7/2015 | Hou | ........................ | H02M 3/04 |
| | | | | 323/234 |

OTHER PUBLICATIONS

"Boost converter," Wikipedia, the free encyclopedia, retrieved from https://en.wikipedia.org/w/index.php?title=Boost_converter &oldid=682394794, Sep. 23, 2015, 7 pp.

"Buck converter," Wikipedia, the free encyclopedia, retrieved from https://en.wikipedia.org/w/index.php?title=Buck_converter &oldid=684073572, Oct. 4, 2015, 16 pp.

"Buck-boost converter," Wikipedia, the free encyclopedia, retrieved from https://en.wikipedia.org/w/index.php?title=Buck-boost_converter&oldid=677171495, Aug. 21, 2015, 8 pp.

"DC-to-DC converter," Wikipedia, the free encyclopedia, retrieved from https://en.wikipedia.org/w/index.php?title=DC-to-DC_converter&oldid=684209874, Oct. 5, 2015, 7 pp.

"Switched-mode power supply," Wikipedia, the free encyclopedia, retrieved from https://en.wikipedia.org/w/index.php?title=Switched-mode_power_supply&oldid=684103888, Oct. 4, 2015, 18 pp.

* cited by examiner

US 9,941,789 B2

FEEDFORWARD CIRCUIT FOR DC-TO-DC CONVERTERS WITH DIGITAL VOLTAGE CONTROL LOOP

TECHNICAL FIELD

The disclosure relates to power converters, and in particular, techniques for controlling a switch of a switched-mode power supply.

BACKGROUND

Some circuits may use power converters that receive a power input from a power source and convert (e.g., step-up or step-down) the power input to a power output that has a different (e.g., regulated) voltage or current level than the voltage or current level of the power input. The converter outputs the power output to a filter for powering a component, a circuit, or other electrical device. Switch-based power converters may use half-bridge circuits and signal modulation techniques to regulate the current or voltage level of a power output. In some examples, power converters may use analog to digital converters (ADCs) to improve the accuracy and control of the voltage or current level of the power output. These ADCs for improving the accuracy and control of the voltage or current of the power output may decrease overall efficiency of the power converter and/or increase the physical size, complexity, and/or cost of the power converter.

SUMMARY

In general, the various examples of this disclosure are directed to DC-to-DC converters, including, but not limited to, buck, boost, or buck-boost DC converters that include a digital voltage control loop and a feedforward circuit. Techniques, devices, and systems as described herein may use the feedforward circuit, which includes supplying an analog input voltage level to a feedforward component in the power converter, to modify the minimum resolution of a digital pulse width modulation (DPWM) signal. The modification of the minimum resolution of the DPWM signal may enhance the capability of the converters to detect and react to an abrupt change in the voltage level of the supplied input voltage, thereby minimizing distortion of the output voltage by fluctuations in the input signal. In one example, the disclosure is directed to a method for controlling a DC-DC power converter comprising receiving a first clock signal; receiving a digital duty cycle value; using the first clock signal and digital duty cycle value to generate a digital pulse width modulation (DPWM) signal having a plurality of discrete steps to control a switch of a switched-mode power supply; and using a voltage control circuit to modify a duration of each of the plurality of discrete steps of the DPWM signal, wherein the voltage control circuit is configured to receive an analog voltage input.

In another example, the disclosure is directed to a switched-mode power supply device comprising a switch; an analog-to-digital converter (ADC) configured to receive a feedback voltage level, and output a digital feedback voltage level; a controller configured to receive the digital feedback voltage level, determine a digital duty cycle value based on the digital feedback voltage level, and output the digital duty cycle value; and a digital pulse width modulator comprising at least one feedforward component configured to modify a duration of each of a plurality of discrete steps of a digital pulse width modulation (DPWM) signal based on a voltage control circuit, wherein the digital pulse width modulator is configured to receive a first clock signal and the digital duty cycle value, and generate the DPWM signal to control the switch, and wherein the voltage control circuit is configured to receive an analog voltage input.

In another example the disclosure, is directed to a system for controlling a DC-DC power converter comprising means for modifying a duration of each of a plurality of discrete steps of a digital pulse width modulation (DPWM) signal based on a voltage control circuit, wherein the voltage control circuit is configured to receive an analog voltage input; means for receiving a first clock signal; means for receiving a digital duty cycle value based on a digital feedback voltage level; and means for generating the DPWM signal based on the first clock signal and the digital duty cycle value to control a switch of a switched-mode power supply.

The details of one or more examples of the techniques of this disclosure are set forth in the accompanying drawings and the description below. Other features, objects, and advantages of the techniques will be apparent from the description and drawings, and from the claims.

DETAILED DESCRIPTION

Figure 1:
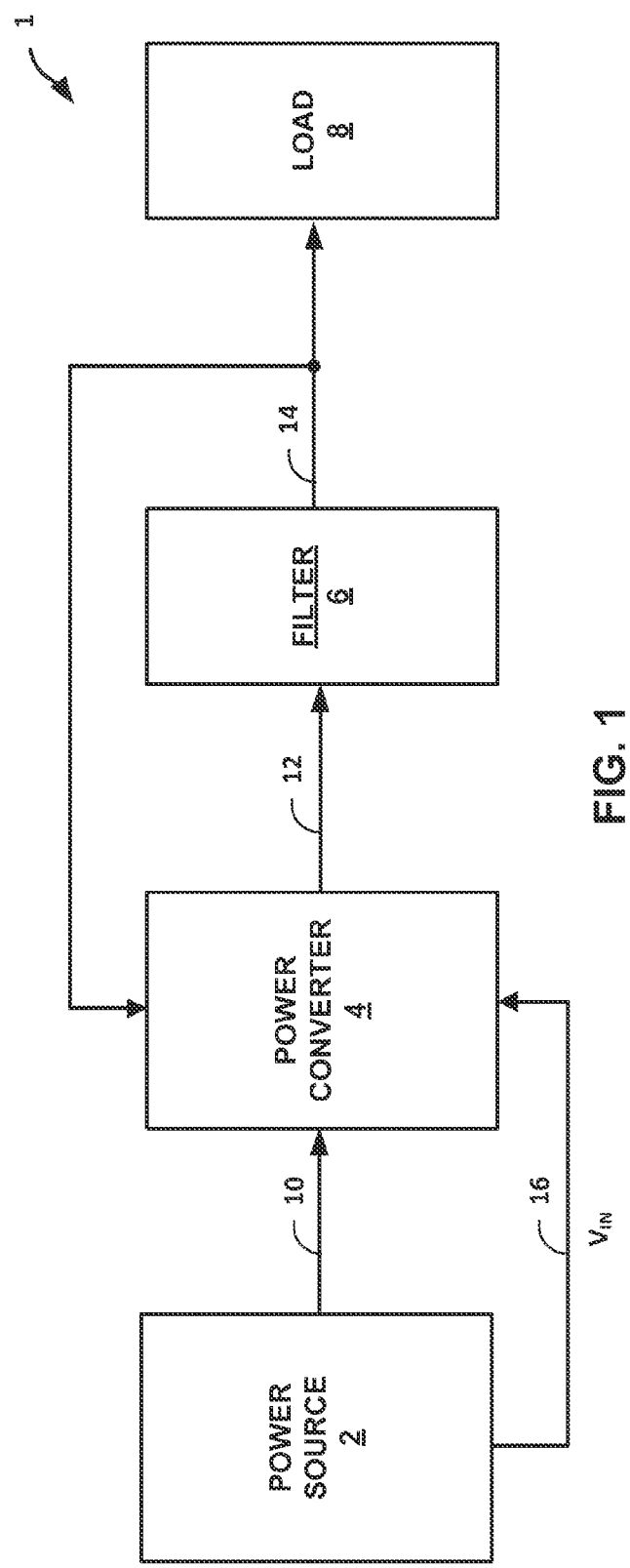
FIG. 1 is a block diagram illustrating an example system for converting power from a power source, in accordance with various examples of this disclosure.

In some applications, a switch-based power converter (hereafter referred to as a "power converter" or simply a "converter") may receive a power input and convert (e.g., by stepping-up or stepping-down) the power input to a power output that has a voltage or current level that is different (e.g., regulated) than the voltage or current level of the power input, for instance, to provide the power output to a filter for powering a load (e.g., a device). As described herein, the term "step-up" refers to a power converter configured to receive an input power signal with a first voltage level, and output a power signal with a second voltage level that is greater than the first voltage level. As also described herein, the term "step-down" converter refers to a power converter configured to receive an input power signal with a first voltage level, and output a power signal with a second voltage level that is less than the first voltage level.

In either case, a power converter may have one or more switches (e.g., MOS power switch transistors based switches, gallium nitride (GaN) based switches, or other types of switch devices) arranged in a power stage configuration (e.g., a single phase, or multi-phase half-bridge configuration, etc.) that the power converter controls, according to one or more modulation techniques, to change the current or voltage level of the power output. A single phase half-bridge may include a high-side switch coupled to a low-side switch at a switching node whereas a multi-phase half-bridge may include multiple high-side switches coupled to multiple low-side switches at a switching node.

A power converter may include one or more gate drivers and control logic to control (e.g., turn-on and turn-off) the one or more switches of the power stage using modulation techniques. Such modulation of the switches of a power stage may operate according to pulse-density-modulation (PDM), pulse-width-modulation (PWM), pulse-frequency-modulation (PFM), or another suitable modulation technique. By controlling the switches of a power stage using modulation techniques, a power converter can regulate the current or voltage level of the power being outputted by the power converter.

Some power converters may use feedback circuits and techniques for performing current sensing and/or voltage sensing to obtain information about a current or voltage level of a power output. The power converter may use the information received using feedback circuits and techniques to improve the accuracy of the power output. For example, the power converter may use the feedback information to contain the voltage or current level of a power output within a particular tolerance or threshold window for satisfying the power requirements of a load. Some power converters may use current sensing as one example of feedback circuits and techniques to determine the real-time current level of the power being outputted to a load. If the power converter determines that the current level does not satisfy the power requirements of the load, then the power converter may adjust or change how the power converter controls the power switches in order to adjust or change the current level of the power output until the current level of the power output is contained within the tolerance window and satisfies the current level associated with the power requirements of the load.

In some examples, a digital voltage control loop for DC-to-DC converters is more desirable than a digital current control loop, as the digital voltage control loop requires less area to implement because the digital voltage control loop may use only an analog-to-digital converter (ADC), a digital proportional-integral-derivative (PID) controller, and a digital pulse width modulator. Unlike the digital current control loop, the digital voltage control loop does not require an interim digital-analog converter (IDAC) or an additional ADC. However, conventional digital voltage control loops lack good line rejection capabilities when compared to digital current control loops, which is an important requirement for DC-to-DC converters.

In some examples, power converters may use feedforward circuits and techniques for performing voltage sensing to obtain information about a voltage level of an input voltage. The power converter may use the information received using feedforward circuits and techniques to improve the accuracy of the power output. For example, the power converter may use the feedforward information to contain the voltage level of a power output within a particular tolerance or threshold window for satisfying the power requirements of a load. As described herein, a feedforward circuit includes one or more feedforward components, where the one or more feedforward components receive the feedforward information.

In some examples, the power converters may use one or more feedforward components and techniques to determine the voltage level of the power source being outputted to the converter. If the power converter determines that the voltage level of the power source has changed, then the power converter may adjust or change how the power converter controls the power switches in order to adjust or change the voltage level of the power output until the voltage level of the power output is contained within the tolerance window and satisfies the voltage level associated with the power requirements of the load.

When using an analog control loop the feedforward circuit was implemented with a sawtooth waveform, where the height of the sawtooth waveform was a function of the input voltage. In this way, the duty cycle was compensated for without the analog control loop having to compensate for the change in input voltage. In conventional digital control loops, a separate ADC has been used to monitor the input voltage instead of the sawtooth waveform. However, the use of the separate ADC requires a complex algorithm to adjust the coefficients and the value of the accumulator so that the gain of the power stage of the power converter is constant. The complex algorithm is also needed so that the feedforward circuit does not require engagement by the PID to compensate for the change in input voltage. In other words, the feedforward circuit for conventional digital control loops is not as robust as the sawtooth waveform for analog control loops.

Techniques, devices, and systems as described herein may modify the minimum resolution of a digital pulse width modulation (DPWM) signal of a digital voltage control loop based on the analog input voltage level of the power source. This modification of the minimum resolution of the DPWM signal may allow the feedforward circuit for a digital voltage control loop to be as robust as the sawtooth waveform for analog control loops.

FIG. 1 is a block diagram illustrating system 1 for converting power from power source 2, in accordance with one or more aspects of the present disclosure. FIG. 1 shows system 1 as having four separate and distinct components shown as power source 2, power converter 4, filter 6, and load 8, however system 1 may include additional or fewer components. For instance, power source 2, power converter 4, filter 6, and load 8 may be four individual components or may represent a combination of one or more components that provide the functionality of system 1 as described herein.

System 1 includes power source 2 which provides electrical power to system 1. Numerous examples of power source 2 exist and may include, but are not limited to, power grids, generators, transformers, batteries, solar panels, windmills, regenerative braking systems, hydro-electrical or wind-powered generators, or any other form of devices that are capable of providing electrical power to system 1.

System 1 includes power converter 4 which operates as a switch-based power converter that converts one form of electrical power provided by power source 2 into a different, and usable form, of electrical power for powering load 8. Power converter 4 may be a step-up converter that outputs power with a higher voltage level than the voltage level of input power received by the step-up converter. One example of such step-up converter may be referred to as a boost converter. Power converter 4 may instead comprise a step-down converter configured to output power with a lower voltage level than the voltage level of input power received by the step-down converter. One example of such a step-down converter may be referred to as a buck converter. In still other examples, power converter 4 may comprise a step-up and step-down converter (e.g., a buck-boost converter) that is capable of outputting power with a voltage level that is higher or lower level than the voltage level of the power input received by the step-up and step-down converter. Examples of power converter 4 may include battery chargers, microprocessor power supplies, and the like. Power converter 4 may operate as a DC-to-DC converter.

System 1 further includes filter 6 and load 8. Load 8 receives the electrical power (e.g., voltage, current, etc.) converted by power converter 4 after the power passes through filter 6. In some examples, load 8 uses the filtered electrical power from power converter 4 and filter 6 to perform a function. Filter 6 is typically a low-pass power analog filter, but may be any suitable electronic filter for filtering power for a load. Examples of filter 6 include, but are not limited to, passive or active electronic filters, high-pass, low-pass, band pass, notch, or all-pass filters, resistor-capacitor filters, inductor-capacitor filters, resistor-inductor-capacitor filters, and the like. Likewise, numerous examples of load 8 exist and may include, but are not limited to, computing devices and related components, such as microprocessors, electrical components, circuits, laptop computers, desktop computers, tablet computers, mobile phones, batteries, speakers, lighting units, automotive/marine/aerospace/train related components, motors, transformers, or any other type of electrical device and/or circuitry that receives a voltage or a current from a power converter.

Power source 2 may provide electrical power with a first voltage or current level over link 10. Load 8 may receive electrical power that has a second voltage or current level, converted by power converter 4, and filtered through filter 6, over link 14. Power source 2 may also provide the first voltage level (e.g., $V_{IN}$) to power converter 4 over link 16. Links 10, 12, 14, and 16 represent any medium capable of conducting electrical power from one location to another. Examples of links 10, 12, 14, and 16 include, but are not limited to, physical and/or wireless electrical transmission mediums such as electrical wires, electrical traces, conductive gas tubes, twisted wire pairs, and the like. Each of links 10 and 12 provide electrical coupling between, respectively, power source 2 and power converter 4, and power converter 4 and filter 6. Link 14 provides electrical coupling between filter 6 and load 8. In addition, link 14 provides a feedback loop or circuit for carrying information to power converter 4 associated with the characteristics of a filtered power output from filter 6. Further, link 16 provides a feedforward circuit for carrying information to power converter 4 associated with the characteristics of the input voltage of power source 2.

In the example of system 1, electrical power delivered by power source 2 can be converted by converter 4 to power that has a regulated voltage and/or current level that meets the power requirements of load 8. For instance, power source 2 may output, and power converter 4 may receive, power which has a first voltage level at links 10 and 16. Power converter 4 may convert the power which has the first voltage level to power which has a second voltage level that is required by load 8. Power converter 4 may output the power that has the second voltage level at link 12. Filter 6 may receive the power from converter 4 and output the filtered power that has the second voltage level at link 14.

Load 8 may receive the filtered power that has the second voltage level at link 14. Load 8 may use the filtered power having the second voltage level to perform a function (e.g., power a microprocessor). Power converter 4 may receive information over link 14 associated with the filtered power that has the second voltage level. For instance, feedback control (e.g., voltage sensing) circuitry of power converter 4 may detect the voltage level of the filtered power output at link 14 and driver/control logic of converter 4 may adjust the power output at link 12 based on the detected voltage level to cause the filtered power output to have a different voltage level that fits within a voltage level tolerance window required by load 8. Power converter 4 may also receive information over link 16 associated with the power source that has the first voltage level. For instance, feedforward control circuitry (e.g., one or more feedforward components) of power converter 4 may use the voltage level of power source 2 at link 16 to modify the minimum resolution of a digital pulse width modulation (DPWM) signal. This modification to the DPWM signal may allow the driver/control logic of converter 4 to not have to adjust the power output at link 12 based on the detected first voltage level.

Figure 2:
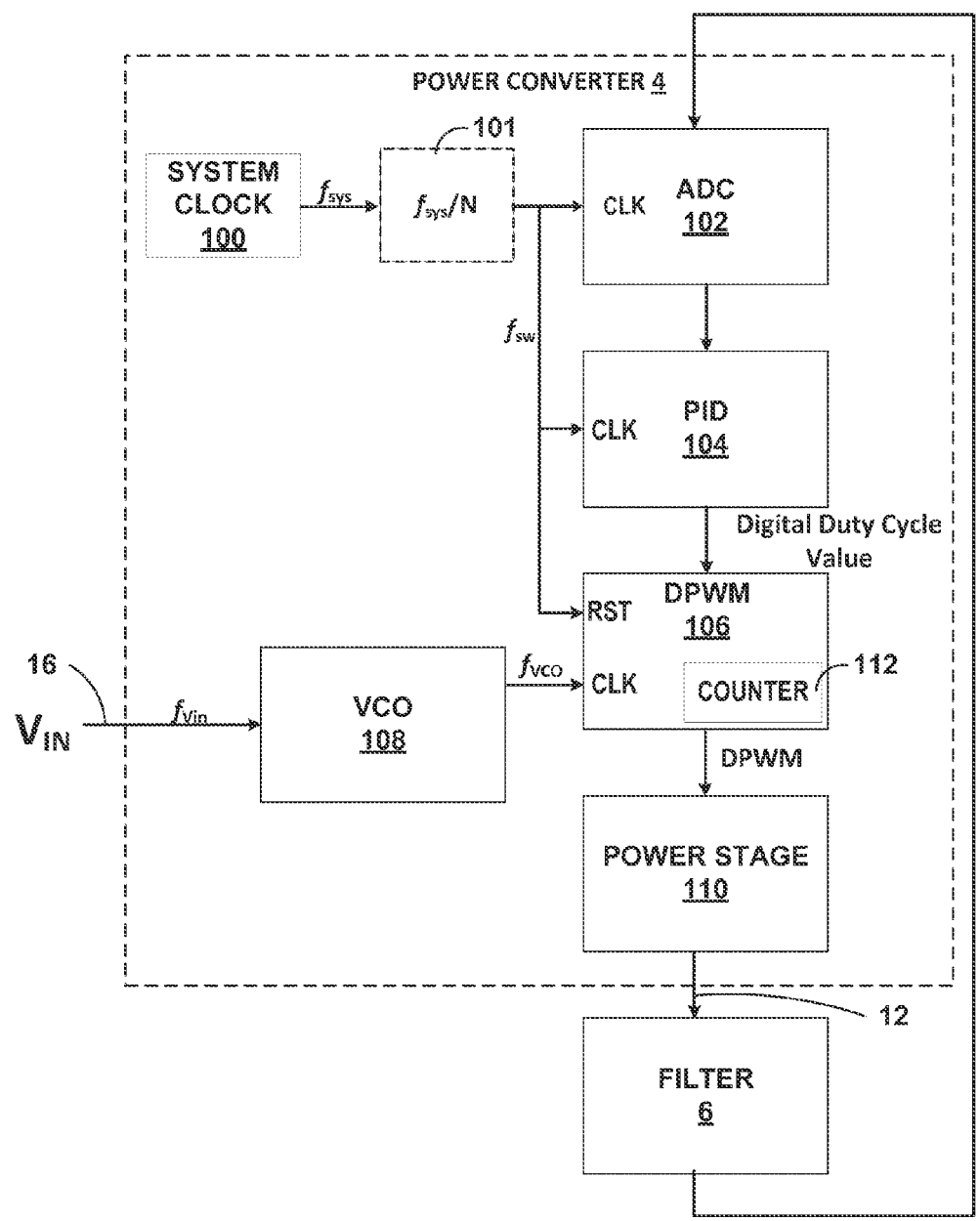
FIG. 2 is a functional block diagram illustrating an example of a power converter including a feedforward component, in accordance with techniques of this disclosure.

FIG. 2 is a functional block diagram illustrating an example of power converter 4 including a feedforward component in accordance with techniques of this disclosure. FIG. 2 is described with reference to FIG. 1. In the example of FIG. 2, power converter 4, filter 6, links 12 and 16 may correspond to power converter 4, filter 6, and links 12 and 16 as described in FIG. 1. In the example of FIG. 2, power converter 4 includes system clock 100, optional clock divider 101, analog-to-digital converter (ADC) 102, proportional-integral-derivative (PID) controller 104, digital pulse width modulator 106, voltage controlled oscillator 108, power stage 110, and counter 112.

System clock 100 provides a clock signal for the operation of power converter 4 with a frequency $f_{sys}$. In some examples, system clock 100 may be a resonant circuit and an amplifier that generates a timing signal. In these examples, the resonant circuit may be a quartz piezo-electric oscillator, a tank circuit, a RC circuit, or any other circuit that can operate as a resonant circuit. Optional clock divider 101 may divide the frequency $f_{sys}$ by a number N, where N is an integer to provide a divided clock signal with a frequency $f_{sw}$ for the operation of power converter 4.

In one example, ADC 102 receives the divided clock signal and a feedback voltage representing the output voltage from filter 6 to load 8 from link 14 to generate a digital feedback voltage. However, in another example, ADC 102 may receive the system clock and a feedback voltage representing the output voltage from filter 6 to load 8 from link 14. In yet a further example, ADC 102 may receive another division from the system clock and a feedback voltage representing the output voltage from filter 6 to load 8 from link 14. In some examples, ADC 102 is a device that converts a continuous physical quantity (e.g., voltage) to a digital representation. For example, ADC 102 may convert a voltage level to a digital number that represents the voltage level. The conversion from analog to digital requires quantization of the input, which introduces error in the digital representation.

In one example, PID controller 104 (hereinafter "PID 104") may receive the divided clock signal and the generated digital feedback voltage to determine a digital duty cycle value required to maintain the regulation of the output voltage at load 8. However, in another example, PID 104 may receive the system clock. In yet a further example, PID 104 receives another division of the system clock. For example, PID 104 continuously calculates an error value as the difference between the digital feedback voltage level and the desired output voltage level at load 8. In this example, PID 104 may determine the digital duty cycle value to minimize the calculated error value.

PID 104 may include memory, such as random access memory (RAM), read only memory (ROM), programmable read only memory (PROM), erasable programmable read only memory (EPROM), electronically erasable programmable read only memory (EEPROM), flash memory, comprising executable instructions for causing the one or more processors to perform the actions attributed to them. Further, PID 104 may be implanted entirely in hardware, software, or a combination thereof.

In some examples, PID 104 may also include one or more processors, such as one or more microprocessors, digital signal processors (DSPs), application specific integrated circuits (ASICs), field programmable gate arrays (FPGAs), or any other equivalent integrated or discrete logic circuitry, as well as any combinations of such components.

VCO 108 receives an analog input voltage level from power source 2 over link 16 and generates a clock signal with a frequency $f_{VCO}$ based on the analog input voltage level. In some examples, VCO 108 is an electronic oscillator with an oscillator frequency that is controlled by a voltage input (e.g., $V_{IN}$ over link 16). In some examples, the clock signal from VCO 108 with the frequency $f_{VCO}$ may be overclocked with respect to the clock signal from system clock 100 and/or the divided clock signal from optional clock divider 101 with the frequency $f_{sw}$.

In some examples, the transfer function for a buck converter may be defined as Equation 1.

$$T_{VCO\_BUCK} = \frac{1}{f_{VCO}} = \frac{V_{OUT}}{V_{IN}} \cdot \frac{T_{sw}}{D_{Desired\_Digital\_Value}} \quad (1)$$

Equation 1 defines the period of the buck converter with VCO 108 as a function of $V_{IN}$. Equation 1 defines the period as equal to one over the frequency of VCO 108 and as equal to $V_{OUT}$ divided by $V_{IN}$ multiplied by the period of the switching frequency divided by the desired digital duty cycle value.

In some examples, the transfer function for a boost converter may be defined as Equation 2.

$$T_{VCO\_BOOST} = \frac{1}{f_{VCO}} = \frac{(V_{OUT} - V_{IN})}{V_{IN}} \cdot \frac{T_{sw}}{D_{Desired\_Digital\_Value}} \quad (2)$$

Equation 2 defines the period of the boost converter with VCO 108 as a function of $V_{IN}$. Equation 2 defines the period as equal to one over the frequency of VCO 108 and as equal to $V_{OUT}$ minus $V_{IN}$ and divided by $V_{IN}$ multiplied by the period of the switching frequency divided by the desired digital duty cycle value.

Digital pulse width modulator 106 receives the divided clock signal as a reset signal and the digital duty cycle value from PID 104. Digital pulse width modulator 106 also receives the clock signal with a frequency $f_{VCO}$ from VCO 108. Digital pulse width modulator 106 generates a digital pulse width modulation (DPWM) signal using counter 112. In some examples, counter 112 may be a device which stores the number of times a particular event has occurred (e.g., each pulse applied to the clock input increments or decrements the number in counter 112). In some examples, digital pulse width modulator 106 may also include a comparator that compares the count of counter 112 to the digital duty cycle value and resets the DPWM signal when the count is equal to the digital duty cycle value.

Digital pulse width modulator 106 may include memory, such as random access memory (RAM), read only memory (ROM), programmable read only memory (PROM), erasable programmable read only memory (EPROM), electronically erasable programmable read only memory (EEPROM), flash memory, comprising executable instructions for causing the one or more processors to perform the actions attributed to them.

In some examples, the digital pulse width modulator 106 may also include one or more processors (e.g., counter 112 and/or the comparator), such as one or more microprocessors, digital signal processors (DSPs), application specific integrated circuits (ASICs), field programmable gate arrays (FPGAs), or any other equivalent integrated or discrete logic circuitry, as well as any combinations of such components.

In the example of FIG. 2, counter 112 generates a DPWM signal by counting upward at a first clock edge of the divided clock signal and counting each pulse in the clock signal from VCO 108 until the second clock edge of the divided clock signal resets the count of counter 112. In this way, the frequency $f_{VCO}$ of the clock signal from VCO 108 which is based on the analog input voltage level of power source 2 determines the minimum resolution of the DPWM signal because counter 112 counts the pulses of the clock signal from VCO 108. In other words, VCO 108 and counter 112 of digital pulse width modulator 106 may combine to form a feedforward component of power converter 4 that modifies the minimum resolution of the DPWM signal based on the analog input voltage level of power source 2.

Power stage 110 receives the DPWM signal from digital pulse width modulator 106 and controls a switch of the converter to regulate a voltage to filter 6. In some examples, power stage 110 may step-down the voltage level (e.g., a buck converter). In other examples, power stage may step-up the voltage level (e.g., a boost converter). Filter 6 receives the regulated output voltage from power stage 110 and filters the output voltage before providing the filtered output voltage to a load (e.g., load 8 as described in FIG. 1).

Figure 3:
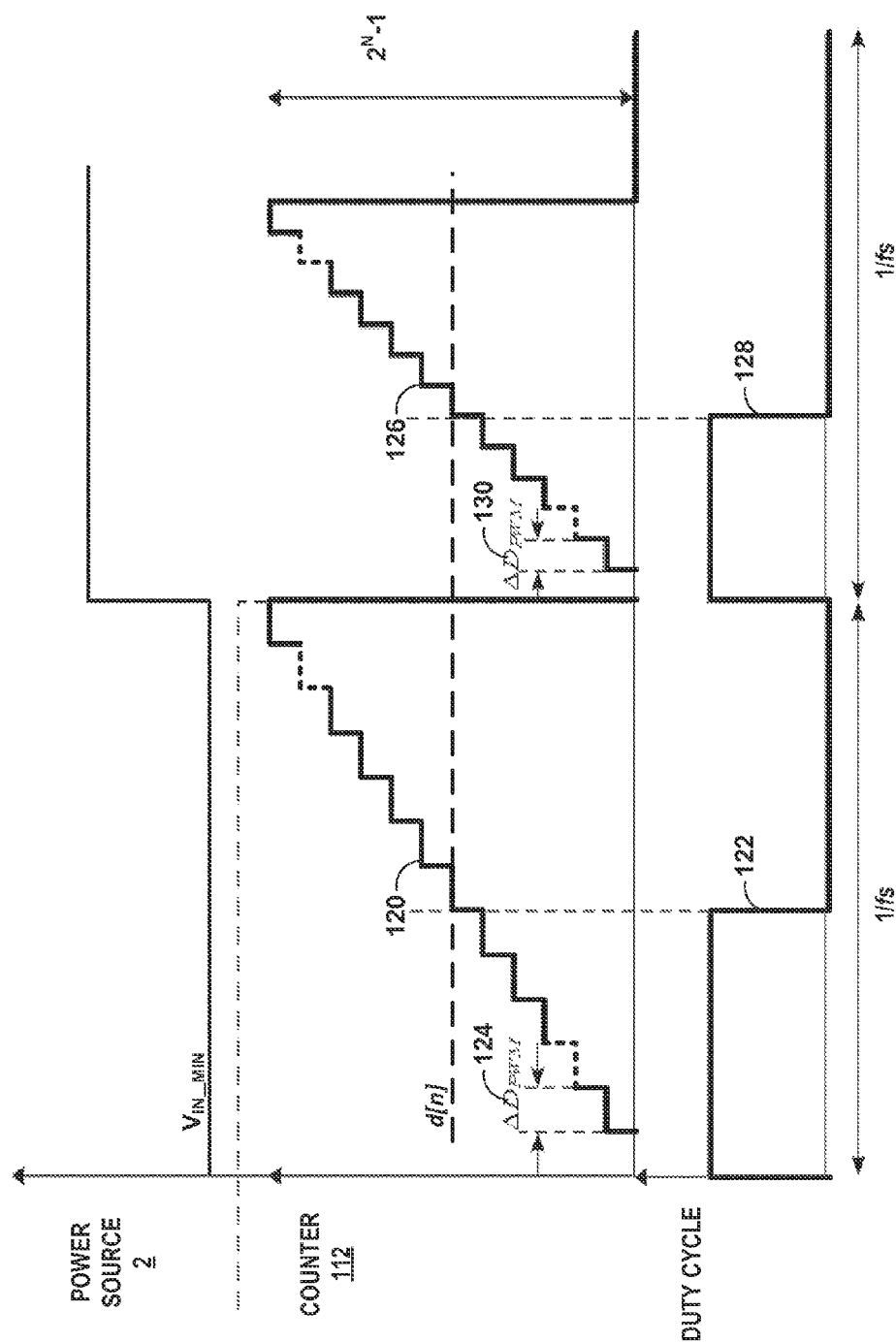
FIG. 3 is a conceptual diagram illustrating an example modification of the minimum resolution of the digital pulse width modulation signal with the example feedforward component of FIG. 2.

FIG. 3 is a conceptual diagram illustrating an example modification of the minimum resolution of the digital pulse width modulation signal with the example feedforward component of FIG. 2. FIG. 3 is described with reference to FIGS. 1 and 2.

In the example of FIG. 3, power source 2 between a first clock edge and a second clock edge of the divided clock signal may have an analog input voltage level $V_{IN\_MIN}$. In the example of FIG. 3, counter 112 may count upward using each pulse from VCO 108 based on analog input voltage level $V_{IN\_MIN}$ to generate DPWM signal 120, which has a minimum resolution of $\Delta D_{PWM}$ 124. In the example of FIG. 3, the digital duty cycle value from PID 104 may correspond to threshold d[n]. For example, the digital duty cycle value from PID 104 may be six and corresponds to threshold d[n] at count six of DPWM signal 120. In some examples, when the count of counter 112 has reached threshold d[n], DPWM signal 120 is reset as illustrated by edge 122 of the duty cycle. That is, although DPWM signal 120 is illustrated in FIG. 3 as being generated by counter 112 beyond threshold d[n], the comparator may be used reset to DPWM signal 120, such that edge 122 of the duty cycle occurs upon reaching threshold d[n].

In the example of FIG. 3, power source 2 between a third clock edge and a fourth clock edge of the divided clock signal may have an analog input voltage level above $V_{IN\_MIN}$. In other examples, power source 2 may have an analog input voltage level below $V_{IN\_MIN}$. In the example of FIG. 3, counter 112 may count upward using each pulse from VCO 108 based on analog input voltage level above $V_{IN\_MIN}$ to generate DPWM signal 126, which has a minimum resolution of $\Delta D_{PWM}$ 130, which is different than $\Delta D_{PWM}$ 124. For example, the minimum resolution of $\Delta D_{PWM}$ 130 may be increased because the frequency of VCO 108 may be increased because the analog input voltage level is above $V_{IN\_MIN}$. In the example of FIG. 3, the digital duty cycle value from PID 104 may correspond to threshold d[n]. For example, the digital duty cycle value from PID 104 may be six and corresponds to threshold d[n] at count six of DPWM signal 126. In some examples, a comparator may determine that the count of counter 112 has reached threshold d[n] and resets DPWM signal 126 as illustrated by edge 128 of the duty cycle. That is, although DPWM signal 126 is illustrated in FIG. 3 as being generated by counter 112 beyond threshold d[n], the comparator may be used reset to DPWM signal 126, such that edge 128 of the duty cycle occurs upon reaching threshold d[n].

In this way, the duty cycle associated with DPWM signal 120 may be greater than the duty cycle associated with DPWM signal 126 because the analog input voltage level of power source 2 has increased causing an increase in the frequency of the clock signal from VCO 108. As both the analog input voltage level of power source 2 and the clock signal from VCO 108 are continuous signals, the feedforward circuit enables the digital voltage control loop of power converter 4 to not have to compensate for changes in the input voltage level and does not require an ADC. Additionally, the feedforward circuit enables the digital voltage control loop to modify the duty cycle similar to the sawtooth waveform of the analog control loop. As described above, these differences may eliminate a number of the drawbacks of the conventional system. In some examples, counter 112 may be an N-bit counter that can count to $2^N-1$.

Figure 4:
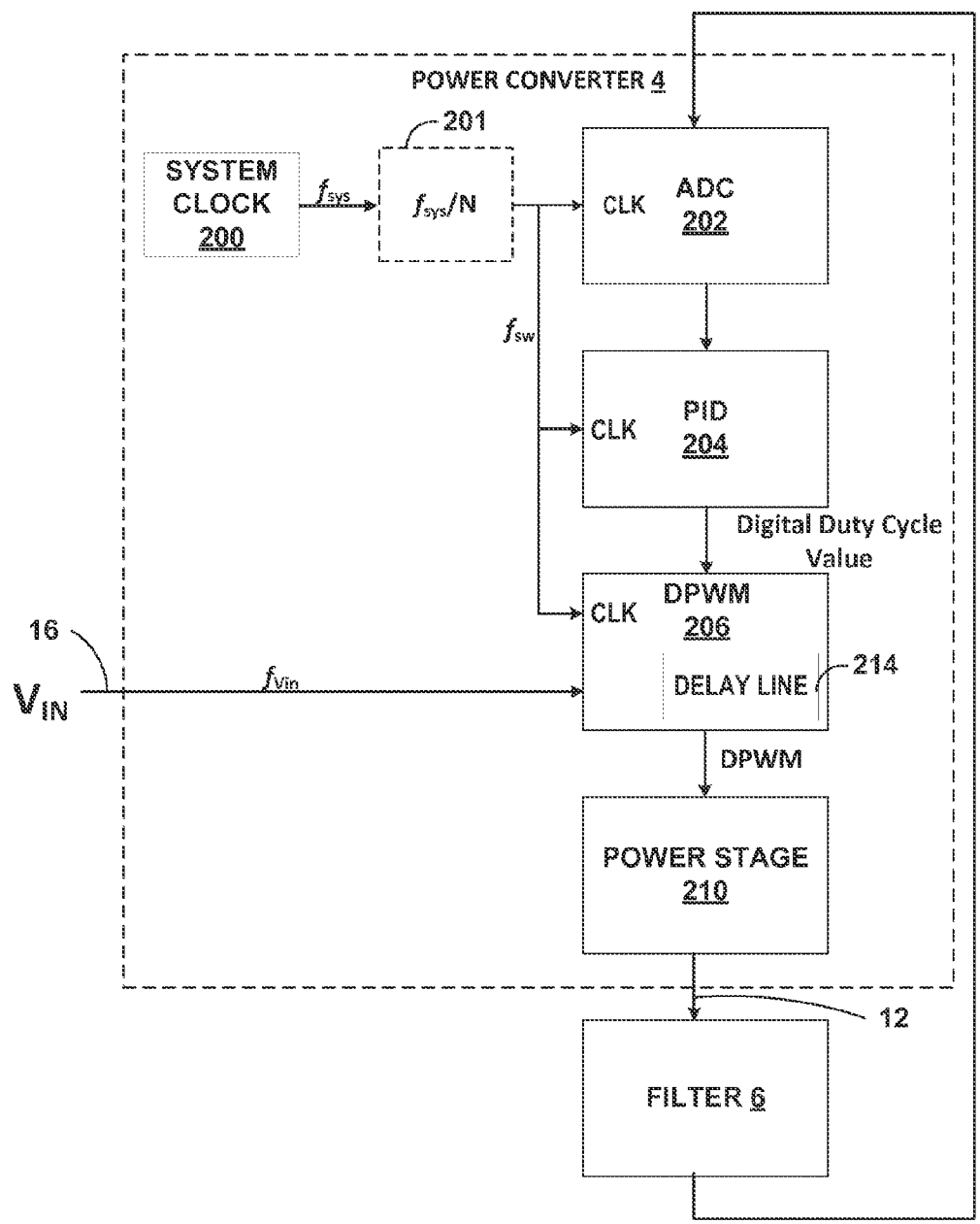
FIG. 4 is a functional block diagram illustrating an example of a power converter including another example feedforward component, in accordance with techniques of this disclosure.

FIG. 4 is a functional block diagram illustrating an example of a power converter including another example feedforward component, in accordance with techniques of this disclosure. FIG. 4 is described with reference to FIGS. 1 and 2. In the example of FIG. 4, power converter 4, filter 6, links 12 and 16 may correspond to power converter 4, filter 6, and links 12 and 16 as described in FIGS. 1 and 3. In the example of FIG. 4, power converter 4 includes system clock 200, optional clock divider 201, analog-to-digital converter (ADC) 202, proportional-integral-derivative (PID) controller 204, digital pulse width modulator 206, power stage 210. In some examples, system clock 200, optional clock divider 201, analog-to-digital converter (ADC) 202, proportional-integral-derivative (PID) controller 204, digital pulse width modulator 206, power stage 210 may correspond to system clock 100, optional clock divider 101, ADC 102, PID 104, digital pulse width modulator 106, and power stage 110, as described in FIG. 2. In contrast to FIG. 2, power converter 4 as illustrated in FIG. 4, additionally includes delay line 214 instead of counter 112 as described in FIG. 2.

System clock 200 provides a clock signal for the operation of power converter 4 with a frequency $f_{sys}$. Optional clock divider 201 may divide the frequency $f_{sys}$ by a number N, where N is an integer to provide a divided clock signal with a frequency $f_{sw}$ for the operation of power converter 4.

ADC 202 receives the divided clock signal and a feedback voltage representing the output voltage from filter 6 to load 8 from link 14 to generate a digital feedback voltage from filter 6. PID 204 receives the divided clock signal and the generated digital feedback voltage to determine a digital duty cycle value required to maintain the regulation of the output voltage at load 8.

Digital pulse width modulator 206 receives the divided clock signal and the digital duty cycle value from PID 204. Digital pulse width modulator 206 generates a digital pulse width modulation (DPWM) signal using delay line 214. In some examples, delay line 214 may be a network of electrical components connected in series, where each individual delay element creates a time difference or phase change between an input signal and an output signal. For example, delay line 214 may be a network of current-starved inverters, where each current-starved creates a time difference between an input signal and an output signal based on the amount of current received by the current-starved inverter. In some examples, delay line 214 may include pass gates (e.g., a multiplexer) that determine a particular number of delay elements necessary to achieve a delay associated with a particular value (e.g., a digital duty cycle value).

In the example of FIG. 4, delay line 214 generates a DPWM signal by setting the DPWM at a first clock edge of the divided clock signal. After setting the DPWM signal, delay line 214 delays the first clock edge of the divided signal based on the digital duty cycle value. After delaying the first clock edge, the pass gates of delay line 214 may output a signal resetb to reset the DPWM signal. In some examples, a number of delay elements of delay line 214 (e.g., a number of current-starved inverters) may receive a reference current based at least in part on the analog input voltage level of power source 2. In these examples, each delay element of delay line 214 determines the length of the minimum resolution of the DPWM signal. In this way, delay line 214 may modify the minimum resolution of the DPWM signal because the delay elements may delay the first clock edge of the clock signal based on the digital duty cycle value and the amount of reference current received by the delay elements. In other words, delay line 214 of digital pulse width modulator 206 may form a feedforward component of power converter 4 that modifies the minimum resolution of the DPWM signal based on the analog input voltage level of power source 2.

Power stage 210 receives the DPWM signal from digital pulse width modulator 206 and controls a switch of power converter 4 to regulate a voltage to filter 6. In some examples, power stage 210 may step-down the voltage level (e.g., a buck converter). In other examples, power stage 210 may step-up the voltage level (e.g., a boost converter). Filter 6 receives the regulated output voltage from power stage 210 and filters the output voltage before providing the filtered output voltage to a load (e.g., load 8 as described in FIG. 1).

Figure 5:
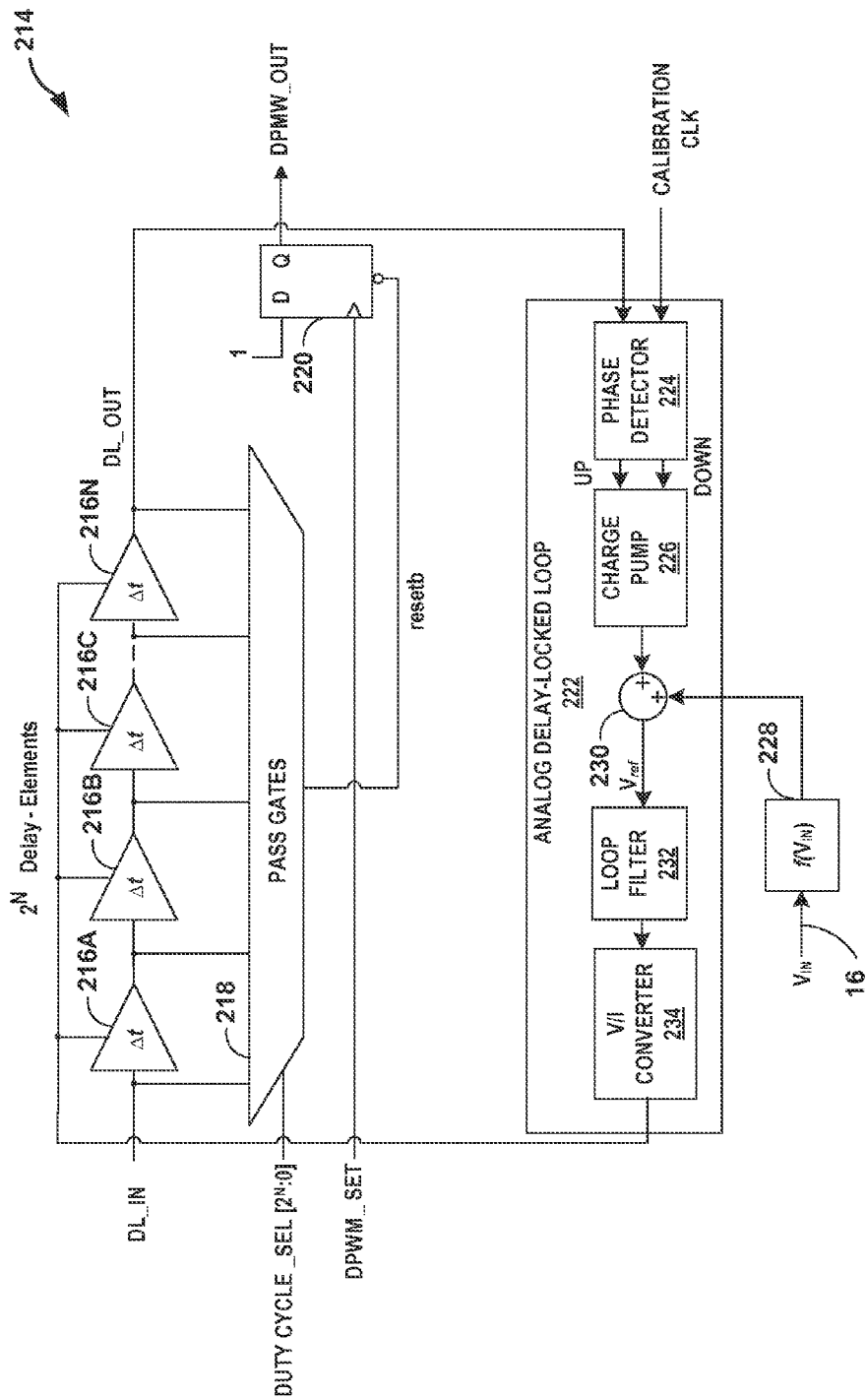
FIG. 5 is a functional block diagram illustrating one example of DPWM 206 as depicted in FIG. 4.

FIG. 5 is a functional block diagram illustrating one example of the feedforward component of FIG. 4. FIG. 5 is described with reference to FIGS. 1 and 4. In the example of FIG. 5, delay line 214 includes current-starved inverters 216A-216N (collectively "current-starved inverters 216"), pass gates 218, D flip-flop 220, analog delay-locked loop 222, and gain block 228. In the example of FIG. 5, analog delay-locked loop 222 includes phase detector 224, charge pump 226, summing node 230, loop filter 232, and voltage-to-current converter 234.

A first clock edge of a clock signal (e.g., the divided clock signal as described in FIG. 4) may be received by 2N number of delay elements. In the example of FIG. 5, the first clock edge is received by D flip flop 220 at DPWM_SET, and D flip flop 220 may set the DPWM signal to high upon receiving the first clock edge. In the example of FIG. 5, pass gates 218 may receive the digital duty cycle value from PID 204 as described in FIG. 4 at input DUTY CYCLE_SEL $[2^N:0]$. Pass gates 218 (e.g., a multiplexer) may determine the number of current-starved inverters 216 needed to correspond to a delay associated with the digital duty cycle value from PID 204. In the example of FIG. 5, the first clock edge may also be received by the number of current-starved inverters 216 determined by pass gates 218 at input DL_IN, and the determined number of current-starved inverters 216 may delay the first clock edge by an amount of time and provide the delay first clock edge to pass gates 218. Pass gates 218 may allow the first clock edge to be passed to D flip flop 220 as signal resetb. In other words, pass gates 218 may reset D flip flop 220 and the DPWM signal using the delayed first clock edge from the determined number of current-starved inverters 216.

The output from current-starved inverters 216 may also be provided to phase detector 224 of analog delay-locked loop 222. Phase detector 224 may compare the output from current-starved inverters 216 to a calibration clock (e.g., the divided clock signal) to determine the amount of delay or time difference. The time difference is provided to charge pump 226, which generates a voltage that is proportional to the phase difference between the two clock edges. In other words, phase detector 224 can detect if the output from current-starved inverters is anticipating or delayed with respect to the calibration clock. The voltage generated by charge pump 226 is added at summing node 230 to a voltage from a gain block 228 that is a function of the analog input voltage level of power source 2 over link 16. Summing node 230 generates a reference voltage $V_{ref}$ and provides the reference voltage $V_{ref}$ to loop filter 232. In some examples, the reference voltage $V_{ref}$ may be used as a reference for modifying a minimum resolution of the DPWM signal and may be inversely proportional to the analog input voltage level of power source 2. Loop filter 232 maintains the stability of the loop and provides the reference voltage $V_{ref}$ to voltage-to-current converter 234. Voltage-to-current converter 234 converts the reference voltage $V_{ref}$ to a reference current $I_{ref}$ and provides the reference current $I_{ref}$ to current-starved inverters 216, thereby determining the minimum resolution of a single bit of the DPWM signal.

In this way, the time length of the whole delay line will be decreased as the analog input voltage level increases and will cause the duty cycle to automatically be reduced. Conversely, in this way, as the analog input voltage level decreases, then the time length of the whole delay line will increase and will cause the duty cycle to automatically be increased.

Figure 6:
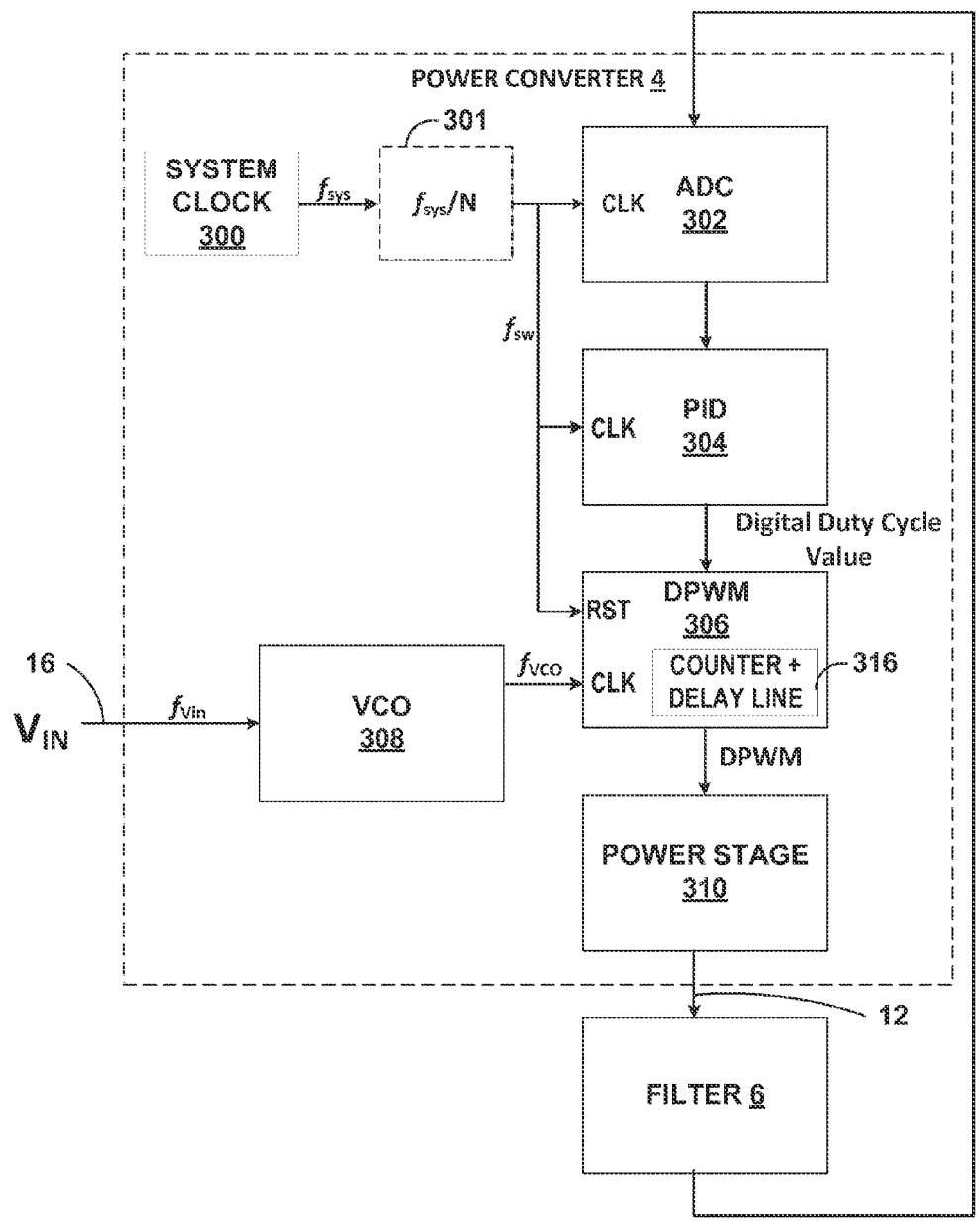
FIG. 6 is a functional block diagram illustrating an example of a power converter including yet another example feedforward component, in accordance with techniques of this disclosure.

FIG. 6 is a functional block diagram illustrating an example of a power converter including yet another example feedforward component, in accordance with techniques of this disclosure. FIG. 6 is described with reference to FIGS. 1 and 2. In the example of FIG. 6, power converter 4, filter 6, links 12 and 16 may correspond to power converter 4, filter 6, and links 12 and 16 as described in FIG. 1. In the example of FIG. 6, power converter 4 includes system clock 300, optional clock divider 301, analog-to-digital converter (ADC) 302, proportional-integral-derivative (PID) controller 304, digital pulse width modulator 306, voltage controlled oscillator 308, and power stage 310, which may correspond to system clock 100, optional clock divider 101, analog-to-digital converter (ADC) 102, proportional-integral-derivative (PID) controller 104, digital pulse width modulator 106, voltage controlled oscillator 108, and power stage 110, as described in FIG. 1. Additionally, in the example of FIG. 6, digital pulse width modulator 306 includes counter and delay line 316.

System clock 300 provides a clock signal for the operation of power converter 4 with a frequency $f_{sys}$. Optional clock divider 301 may divide the frequency $f_{sys}$ by a number N, where N is an integer to provide a divided clock signal with a frequency $f_{sw}$ for the operation of power converter 4.

ADC 302 receives the divided clock signal and a feedback voltage representing the output voltage from filter 6 to load 8 from link 14 to generate a digital feedback voltage. PID 304 receives the divided clock signal and the generated digital feedback voltage to determine a digital duty cycle value required to maintain the regulation of the output voltage at load 8.

VCO 308 receives an analog input voltage level from power source 2 over link 16 and generates a clock signal with a frequency $f_{VCO}$ based on the analog input voltage level. In some examples, the clock signal from VCO 308 with the frequency $f_{VCO}$ may be overclocked with respect to the clock signal from system clock 300 and/or the divided clock signal from optional clock divider 301 with the frequency $f_{sys}$.

Digital pulse width modulator 306 receives the divided clock signal as a reset signal and the digital duty cycle value from PID 304. Digital pulse width modulator 306 also receives the clock signal with a frequency $f_{VCO}$ from VCO 308. Digital pulse width modulator 306 generates a digital pulse width modulation (DPWM) signal using counter and delay line 316. In some examples, the counter portion of counter and delay line 316 may correspond to counter 112 as described in FIG. 2. In some examples, the delay line portion of counter and delay line 316 may correspond to delay line 214 as described in FIG. 4.

In the example of FIG. 6, counter and delay line 316 generates a DPWM signal by counting upward with a counter portion at a first clock edge of the divided clock signal and counting each pulse in the clock signal from VCO 108 (e.g., the minimum resolution of the DPWM signal) until a comparator detects the count of the counter portion is equal to a portion of the digital duty cycle value (e.g., the most significant bits of the digital duty cycle value). When the comparator detects the count is equal to the portion of the digital duty cycle value, then the comparator may trigger a delay line portion of counter and delay line 316, which may correspond to delay line 214 as described in FIGS. 4 and 5. When the delay line portion is triggered, the delay line may use a number of delay elements to delay a pulse of the clock signal from VCO 308 based on the remaining portion of the digital duty cycle value (e.g., the least significant bits of the digital duty cycle value) to reset the DPWM signal. In this way, the frequency $f_{VCO}$ of the clock signal from VCO 308 which is based on the analog input voltage level of power source 2 determines the minimum resolution of the DPWM signal because counter 112 counts the pulses of the clock signal from VCO 308 that are dependent on the analog input voltage level of power source 2.

In some examples, the number of delay elements used to delay the pulse may receive a reference current to determine an amount of time delay, and the reference current may be dependent at least in part on the analog input voltage level of power source 2. In this way, the amount of time delay from the number of delay elements used by the delay portion of counter and delay line 316 is based on the analog input voltage level of power source 2, such that the delay line portion may also determine the minimum resolution of the DPWM signal. In some examples, a second edge of the divided clock signal may reset the count of the counter portion of the count and delay line 316. Although, FIG. 6 has been described as the counter portion trigger the delay line portion, in some examples, other configurations and combinations may be suitable including the opposite configuration. For example, the delay portion may be used to delay the clock signal from VCO 308 and provide the delayed clock signal to the counter portion. In this example, the minimum resolution of the DPWM signal may be equal to $1/(N_{DELAY\_ELEMENTS} f_{VCO})$.

Power stage 110 may receive the DPWM signal from digital pulse width modulator 106 and control a switch of the converter to regulate an output voltage provided to filter 6. In some examples, power stage 110 may step-down the voltage level (e.g., a buck converter). In other examples, power stage may step-up the voltage level (e.g., a boost converter). Filter 6 receives the regulated output voltage from power stage 110 and filters the output voltage before providing the filtered output voltage to a load (e.g., load 8 as described in FIG. 1).

Figure 7:
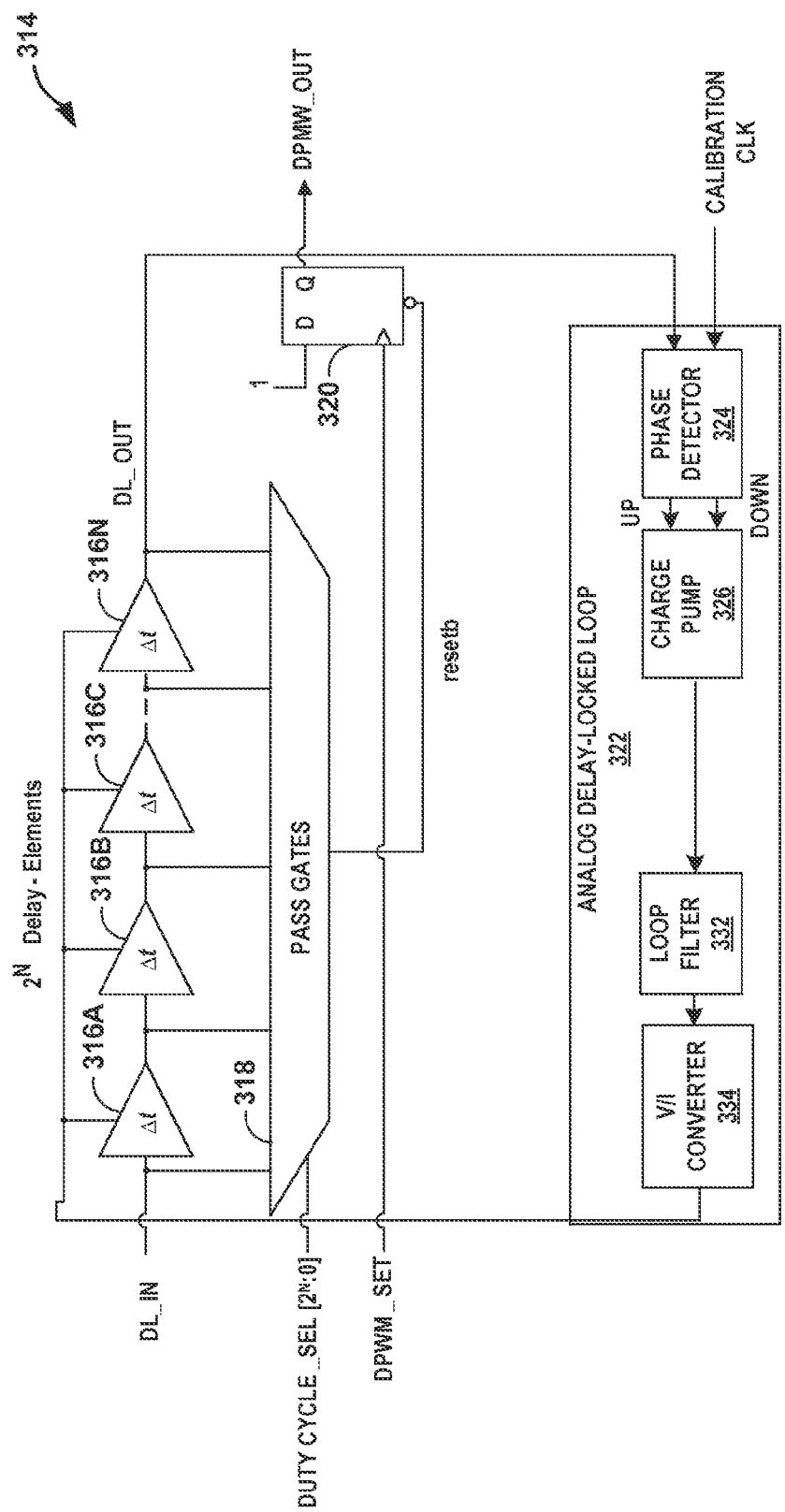
FIG. 7 is a functional block diagram illustrating one example of DPWM 306 as depicted in FIG. 6.

FIG. 7 is a functional block diagram illustrating one example of the feedforward component of FIG. 7. FIG. 7 is described with reference to FIGS. 1 and 4. In the example of FIG. 7, delay line 314 includes current-starved inverters 316A-316N (collectively "current-starved inverters 316"), pass gates 318, D flip-flop 320, and analog delay-locked loop 322. In the example of FIG. 7, analog delay-locked loop 322 includes phase detector 324, charge pump 326, loop filter 332, and voltage-to-current converter 334.

A first clock edge of a clock signal (e.g., the divided clock signal as described in FIG. 6) may be received by 2N number of delay elements. In the example of FIG. 7, the first clock edge is received by D flip flop 320 at DPWM_SET, and D flip flop 320 may set the DPWM signal to high upon receiving the first clock edge. In the example of FIG. 7, pass gates 318 may receive the digital duty cycle value from PID 304 as described in FIG. 6 at input DUTY CYCLE_SEL [$2^N$:0]. Pass gates 318 (e.g., a multiplexer) may determine the number of current-starved inverters 316 needed to correspond to a delay associated with the digital duty cycle value from PID 304. In the example of FIG. 6, the first clock edge may also be received by the number of current-starved inverters 316 determined by pass gates 318 at input DL_IN, and the determined number of current-starved inverters 316 may delay the first clock edge by an amount of time and provide the delay first clock edge to pass gates 318. Pass gates 318 may allow the first clock edge to be passed to D flip flop 320 as signal resetb. In other words, pass gates 318 may reset D flip flop 320 and the DPWM signal using the delayed first clock edge from the determined number of current-starved inverters 316.

The output from current-starved inverters 316 may also be provided to phase detector 324 of analog delay-locked loop 322. Phase detector 324 may compare the output from current-starved inverters 316 to a calibration clock (e.g., the divided clock signal) to determine the amount of delay or time difference. The time difference is provided to charge pump 326, which generates a voltage that is proportional to the phase difference between the two clock edges. In other words, phase detector 324 can detect if the output from current-starved inverters is anticipating or delayed with respect to the calibration clock. The voltage generated by charge pump 326 is provided to loop filter 332. Loop filter 332 maintains the stability of the loop and provides the reference voltage $V_{ref}$ to voltage-to-current converter 334. Voltage-to-current converter 334 converts the reference voltage $V_{ref}$ to a reference current $I_{ref}$ and provides the reference current $I_{ref}$ to current-starved inverters 316, thereby determining the minimum resolution of a single bit of the DPWM signal.

In this way, the time length of the whole delay line will be decreased as the analog input voltage level increases and will cause the duty cycle to automatically be reduced. Conversely, in this way, as the analog input voltage level decreases, then the time length of the whole delay line will increase and will cause the duty cycle to automatically be increased.

Figure 8:
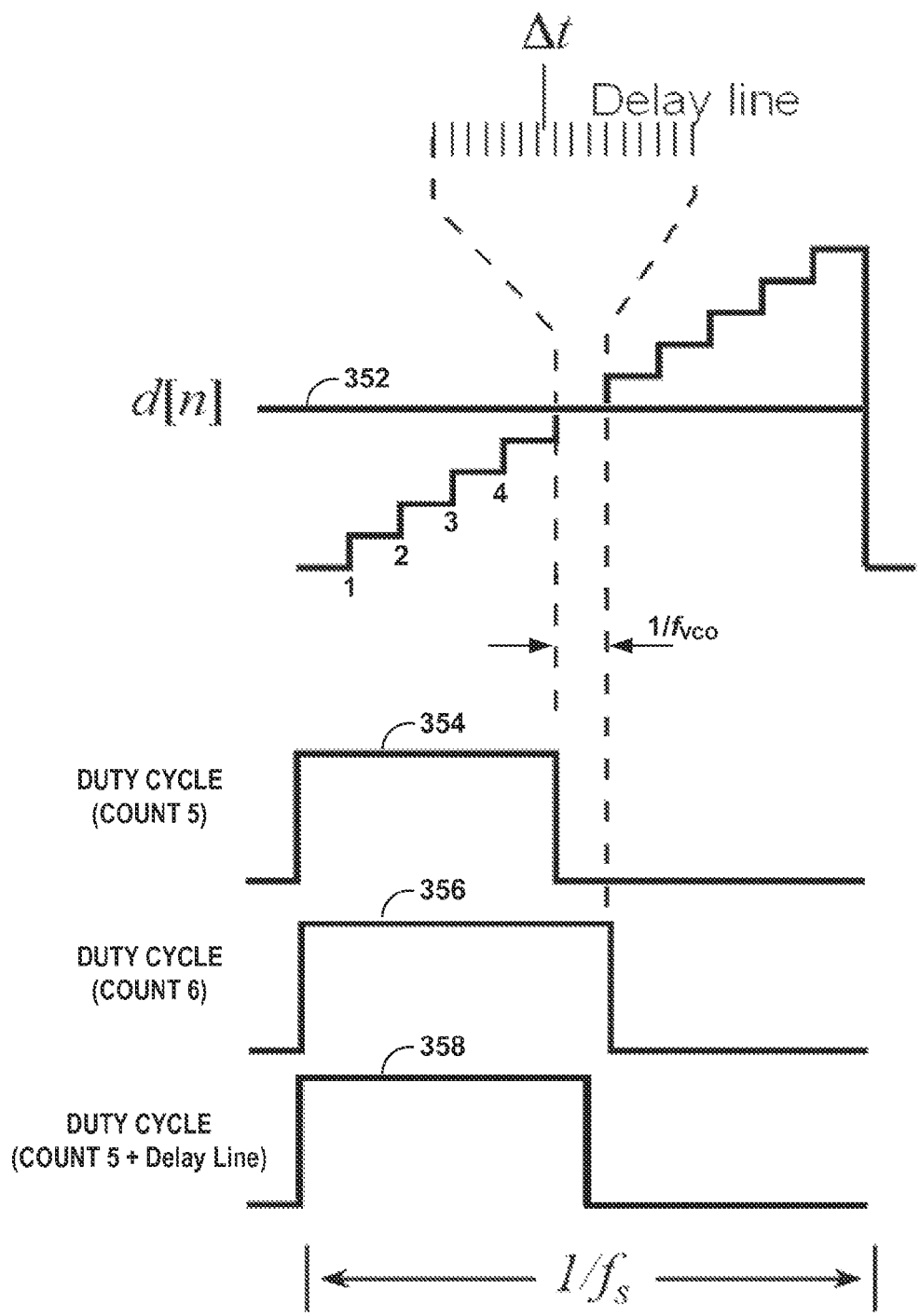
FIG. 8 is a conceptual diagram illustrating an example modification of the minimum resolution of the digital pulse width modulation signal with the example feedforward component of FIG. 6.

FIG. 8 is a conceptual diagram illustrating an example modification of the minimum resolution of the digital pulse width modulation signal with the example feedforward component of FIG. 7. FIG. 8 is described with reference to FIG. 7. As illustrated in FIG. 8, counter and delay line 316 may generate a DPWM signal by counting upward based a minimum resolution of the counter portion of counter and delay line 316, which is each pulse in the clock signal from VCO 308 or $1/f_{VCO}$. In some examples, each pulse in the clock signal from VCO 308 is dependent on the analog input voltage level of power source 2. In this way, the minimum resolution of the counter portion of counter and delay line is dependent on the analog input voltage level of power source 2.

In some examples, when the upward count of the counter portion of count and delay line 316 is five, then a comparator of count and delay line 316 may determine that the count is equal to the digital duty cycle value (e.g., threshold d[n]), and the comparator may reset the DPWM signal, where the DPWM signal has duty cycle 354. However, if the upward count of the counter portion of count and delay line 316 continued to count to six, and the comparator reset the DPWM signal, then the DPWM signal would have duty cycle 356.

In some examples, the minimum resolution of the counter portion of counter and delay line 316 is insufficient rendering duty cycles 354 and 356 insufficient. In these examples, the delay line portion of counter and delay line 316 may provide additional resolution. For example, when the upward count of the counter portion of count and delay line 316 is five, then a comparator count and delay line 316 may determine that the count is equal to the digital duty cycle value (e.g., threshold d[n]), and the comparator may trigger the delay line portion of counter and delay line 316.

Upon triggering the delay line portion, the delay line portion may delay a pulse of the clock signal from VCO 308, and the delayed pulse may reset the DPWM signal to have duty cycle 358, which is between duty cycles 354 and 356.

In other words, the delay line portion may add resolution to the minimum resolution provided by the counter portion. In some examples, the additional resolution may be two to four bits of additional resolution. In some examples, the additional resolution may correspond to the least significant bits of the digital duty cycle value.

In the example of FIG. 8, the digital duty cycle value determined by PID 304 may have the most significant bits equal to five or 0101 binary and may have the least significant bits equal to seven or 0111 in binary. In this example, when the comparator detects the count of the counter portion is equal to five, then the comparator may trigger the delay line portion to delay the fifth pulse of the clock signal from VCO 308 with $2^N$ of delay elements, where N is equal to 7, and the delayed fifth pulse will reset the DPWM signal. In this way, counter and delay line 316 may generate a DPWM signal with duty cycle 358.

In the example of FIG. 8, the overclocking of the clock signal from VCO 308 with respect to system clock 300 generates steps within the switching cycle of the DC-to-DC converter $1/f_s$ which is equal to $1/f_{VCO}$. In this way, a combination of the counter portion and the delay line portion of counter and delay line 316 may be used to increase the resolution and modification of the DPWM signal while avoiding cycle limits and increases in the area of implementation, among other advantages.

Figure 9:
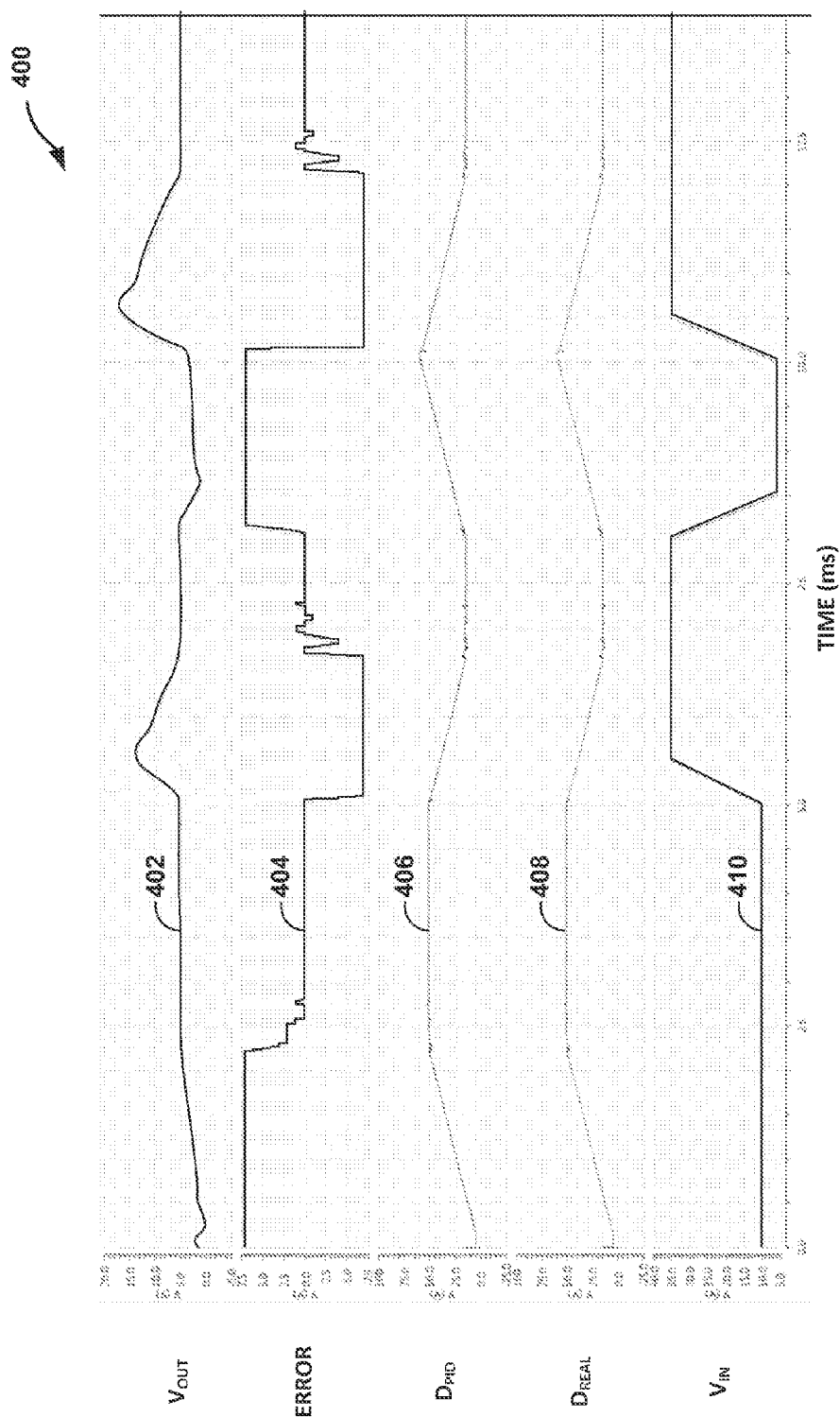
FIG. 9 is a graphical illustration illustrating characteristics of an example buck converter without a feedforward circuit.

FIG. 9 is a graphical illustration illustrating characteristics of an example buck converter without a feedforward circuit. For ease of understanding, FIG. 9 is described with reference to FIGS. 1 and 2; however, FIG. 9 may also be applicable to FIGS. 4 and 6.

In the example of FIG. 9, graphical illustration 400 includes $V_{OUT}$ signal 402, error signal 404, $D_{PID}$ signal 406, $D_{REAL}$ signal 408, and $V_{IN}$ signal 410. In some examples, $V_{OUT}$ signal 402 may represent the output voltage over time from power converter 4 when power converter 4 is a buck converter without a feedforward circuit. In other examples, $V_{OUT}$ signal 402 may represent the output voltage over time from filter 6 over link 14 when power converter 4 is a buck converter without a feedforward circuit. Error signal 404 represents the error calculated over time by ADC 102 between a digital feedback voltage level corresponding to $V_{OUT}$ signal 402 and a desired voltage level. $D_{PID}$ signal 406 represents the determined digital duty cycle value over time by PID 104 to achieve the desired voltage level at the output of power converter 4. $D_{REAL}$ signal 408 represents the actual duty cycle over time to achieve the desired voltage level at the output of power converter 4. $V_{IN}$ signal 410 represents the analog input voltage level of power source 2 over time.

As illustrated by $V_{IN}$ signal 410 and $V_{OUT}$ signal 402 of FIG. 9, increases in the analog input voltage level of power source 2 cause spikes in the output voltage. For example, a twenty-five volt (V) increase in the analog input voltage level of power source 2 may cause between a nine volt and a thirteen volt increase in the output voltage. Additionally, as illustrated by $D_{PID}$ signal 406 and $D_{REAL}$ signal 408 of FIG. 9, when power converter 4 does not have a feedforward circuit, PID 104 may determine the digital duty cycle value based on both the input voltage and the output voltage in order to compensate for changes in the analog input voltage level. In this way, $D_{REAL}$ signal 408 mirrors $D_{PID}$ signal 406 because without a feedforward circuit only PID 104 is able to compensate for the changes in both the input voltage and the output voltage.

Figure 10:
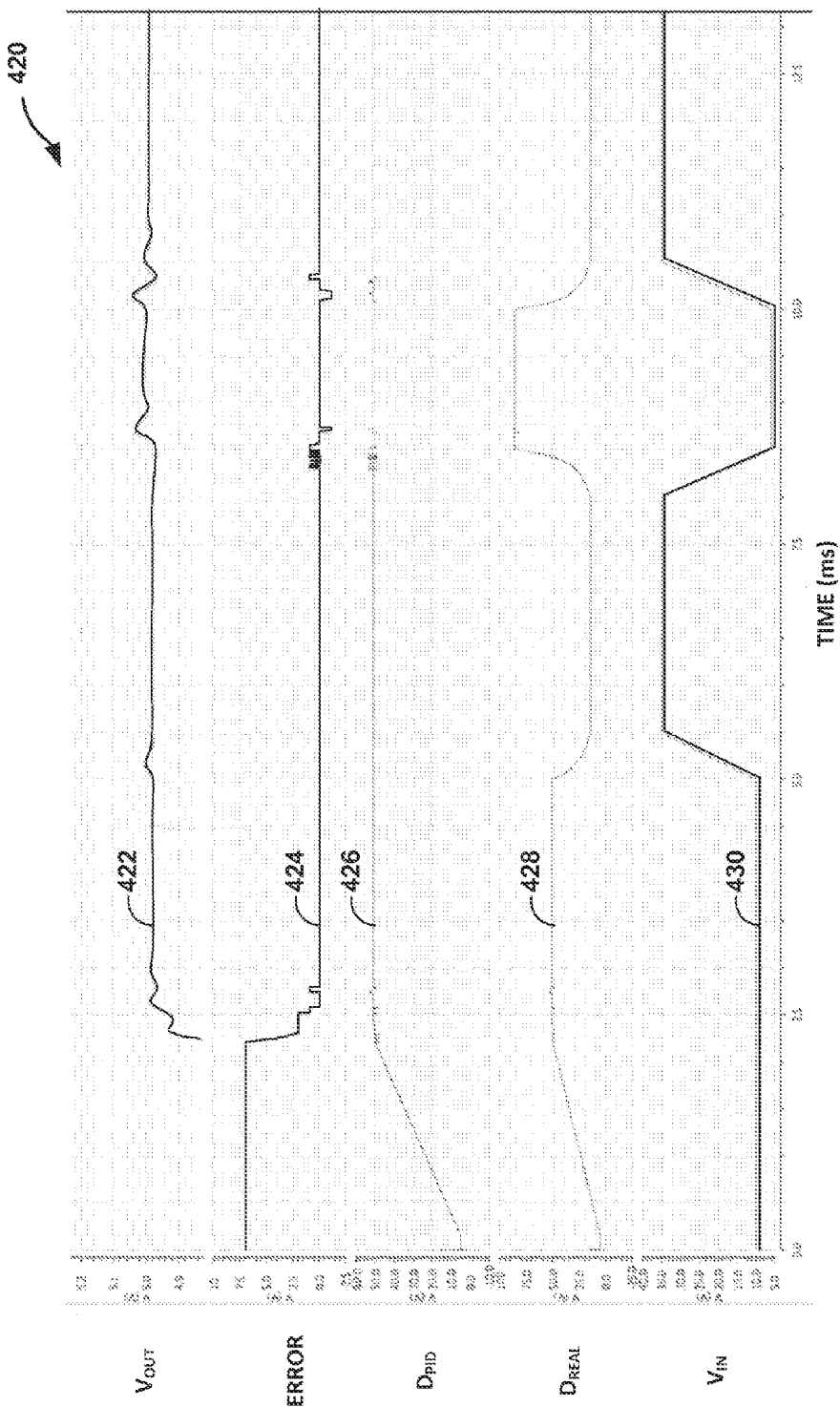
FIG. 10 is a graphical illustration illustrating characteristics of an example buck converter with a feedforward circuit, in accordance with techniques of this disclosure.

FIG. 10 is a graphical illustration illustrating characteristics of an example buck converter with a feedforward circuit, in accordance with this disclosure. For ease of understanding, FIG. 10 is described with reference to FIGS. 1 and 2; however, FIG. 10 may also be applicable to FIGS. 4 and 6.

In the example of FIG. 10, graphical illustration 420 includes $V_{OUT}$ signal 422, error signal 424, $D_{PID}$ signal 426, $D_{REAL}$ signal 428, and $V_{IN}$ signal 430, which may be similar to $V_{OUT}$ signal 402, error signal 404, $D_{PID}$ signal 406, $D_{REAL}$ signal 408, and $V_{IN}$ signal 410, as described in FIG. 9. In some examples, $V_{OUT}$ signal 422 may represent the output voltage over time from power converter 4 when power converter 4 is a buck converter with a feedforward circuit. In other examples, $V_{OUT}$ signal 422 may represent the output voltage over time from filter 6 over link 14 when power converter 4 is a buck converter with a feedforward circuit. Error signal 424 represents the error calculated over time by PID 104 between a digital feedback voltage level corresponding to $V_{OUT}$ signal 422 and a desired voltage level. $D_{PID}$ signal 426 represents the determined digital duty cycle value over time by PID 104 to achieve the desired voltage level at the output of power converter 4. $D_{REAL}$ signal 428 represents the actual duty cycle over time to achieve the desired voltage level at the output of power converter 4. $V_{IN}$ signal 430 represents the analog input voltage of power source 2 over time.

As illustrated by $V_{IN}$ signal 430 and $V_{OUT}$ signal 422 of FIG. 10, increases in the analog input voltage level of power source 2 may cause spikes in the output voltage, however, the spikes may be significantly reduced when compared to FIG. 9. For example, a twenty-five volt (V) increase in the analog input voltage level of power source 2 may no longer cause between a nine volt and a thirteen volt spike in the output voltage, but instead may cause only a 100 millivolt ripple. Additionally, as illustrated by $D_{PID}$ signal 426 and $D_{REAL}$ signal 428 of FIG. 10, when power converter 4 has a feedforward circuit in accordance with the techniques described herein, PID 104 determines the digital duty cycle value based on the output voltage because the feedforward circuit already compensates for changes in the analog input voltage level of power source 2. In this way, the digital duty cycle value determined by PID 104 after reaching a steady state is substantially constant as illustrated by $D_{PID}$ signal 426 when compared to $D_{PID}$ signal 406 of FIG. 9. In some examples, PID 104 may require significantly less processing to determine the digital duty cycle value because of the feedforward circuit, which may cause a reduction in variation in the line step response, among other advantages.

Additionally, in some examples, the compensation provided by the feedforward circuit to the actual duty cycle may react faster to changes in the analog input voltage level of power source 2 as illustrated by $D_{REAL}$ signal 428 when compared to $D_{REAL}$ signal 408 of FIG. 9. For example, $D_{REAL}$ signal 428 may be able to achieve steady state at about 0.5 milliseconds (ms), which directly corresponds to the amount of time that the analog input voltage level took to achieve a steady state (e.g., 0.5 ms). Comparatively, for example, $D_{REAL}$ signal 408 may be able to achieve steady state between 1.7 ms and 4 ms depending on the changes to the analog input voltage level as illustrated in FIG. 9.

Figure 11:
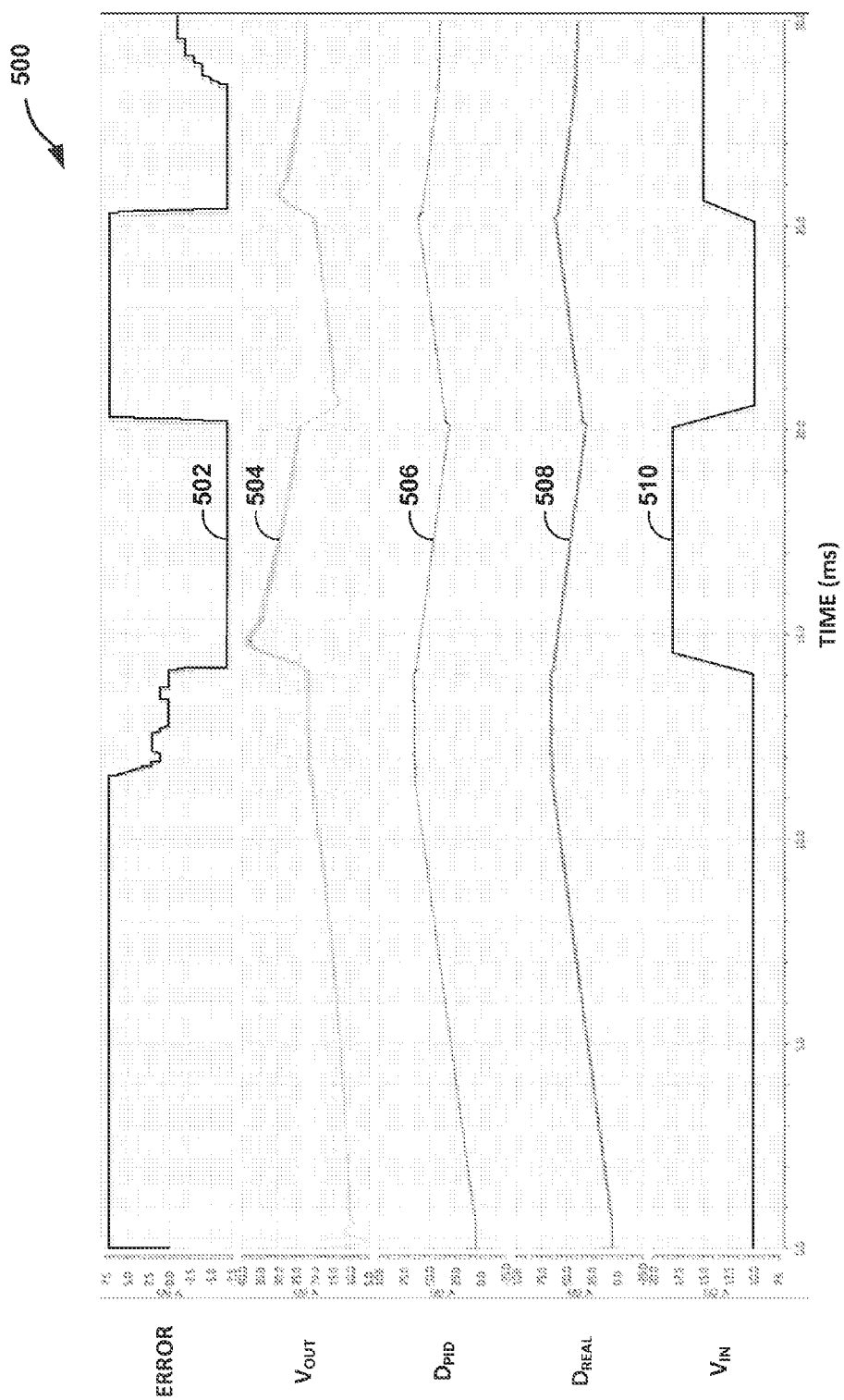
FIG. 11 is a graphical illustration illustrating characteristics of an example boost converter without a feedforward circuit.

FIG. 11 is a graphical illustration illustrating characteristics of an example boost converter without a feedforward circuit. For ease of understanding, FIG. 11 is described with reference to FIGS. 1 and 2; however, FIG. 11 may also be applicable to FIGS. 4 and 6.

In the example of FIG. 11, graphical illustration 500 includes error signal 502, $V_{OUT}$ signal 504, $D_{PID}$ signal 506, $D_{REAL}$ signal 508, and $V_{IN}$ signal 510. Error signal 502 represents the error calculated over time by PID 104 between a digital feedback voltage level corresponding to $V_{OUT}$ signal 504 and a desired voltage level. In some examples, $V_{OUT}$ signal 504 may represent the output voltage over time from power converter 4 when power converter 4 is a boost converter without a feedforward circuit. In other examples, $V_{OUT}$ signal 504 may represent the output voltage over time from filter 6 over link 14 when power converter 4 is a boost converter without a feedforward circuit. $D_{PID}$ signal 506 represents the determined digital duty cycle value over time by PID 104 to achieve the desired voltage level at the output of power converter 4. $D_{REAL}$ signal 508 represents the actual duty cycle over time to achieve the desired voltage level at the output of power converter 4. $V_{IN}$ signal 510 represents the analog input voltage level of power source 2 over time.

As illustrated by $V_{IN}$ signal 510 and $V_{OUT}$ signal 504 of FIG. 11, increases in the analog input voltage level of power source 2 cause spikes in the output voltage. For example, an eight volt (V) increase in the analog input voltage level of power source 2 may cause a sixteen volt increase in the output voltage. Additionally, as illustrated by $D_{PID}$ signal 506 and $D_{REAL}$ signal 508 of FIG. 11, when power converter 4 does not have a feedforward circuit, PID 104 has to determine the digital duty cycle value based on both the input voltage and the output voltage in order to compensate for changes in the analog input voltage level. In this way, $D_{REAL}$ signal 508 mirrors $D_{PID}$ signal 506 because without a feedforward circuit only PID 104 is able to compensate for the changes in both the input voltage and the output voltage.

Figure 12:
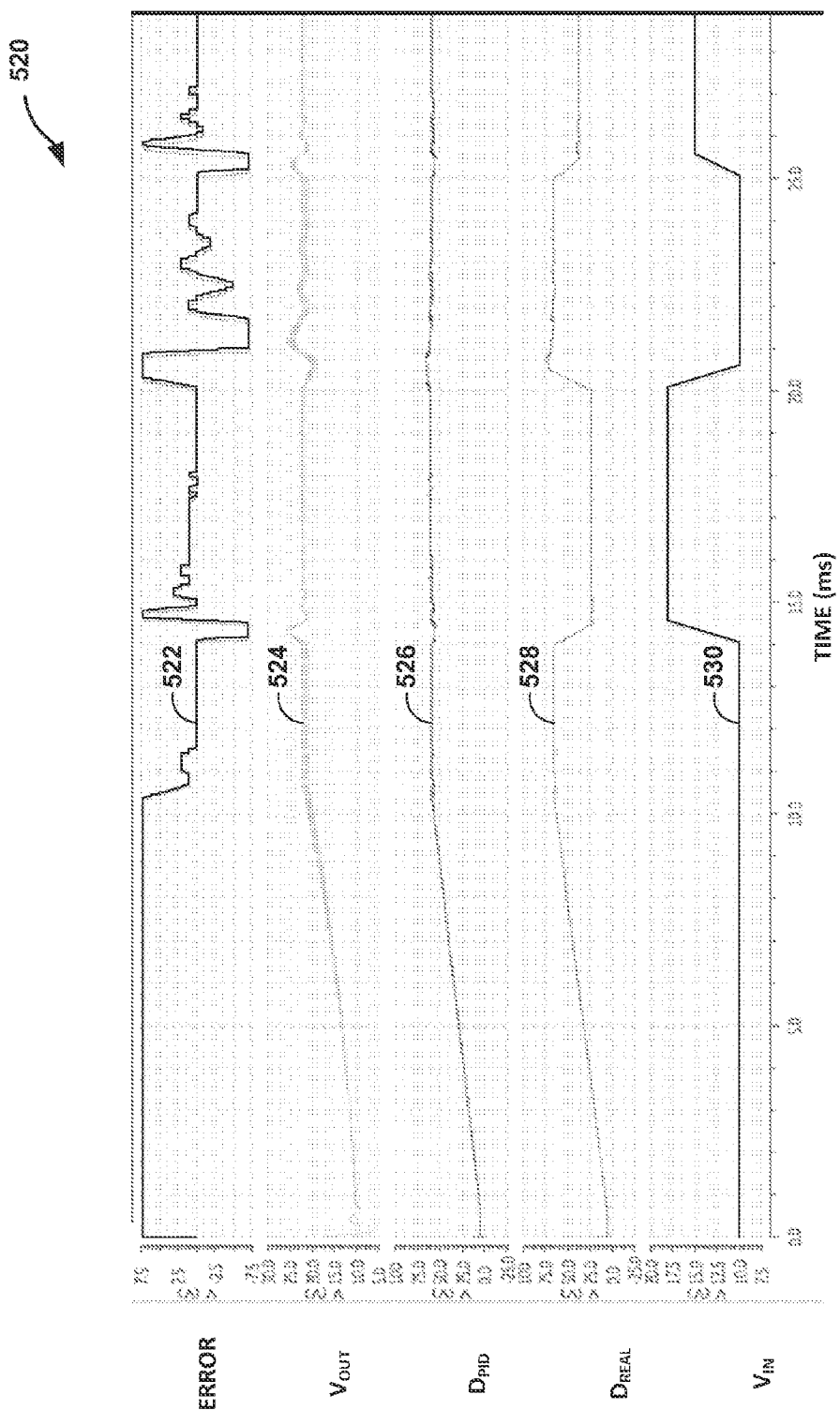
FIG. 12 is a graphical illustration illustrating characteristics of an example boost converter with a feedforward circuit, in accordance with techniques of this disclosure.

FIG. 12 is a graphical illustration illustrating characteristics of an example boost converter with a feedforward circuit, in accordance with techniques of this disclosure. For ease of understanding, FIG. 12 is described with reference to FIGS. 1 and 2; however, FIG. 12 may also be applicable to FIGS. 4 and 6.

In the example of FIG. 12, graphical illustration 520 includes error signal 522, $V_{OUT}$ signal 524, $D_{PID}$ signal 526, $D_{REAL}$ signal 528, and $V_{IN}$ signal 530, which may be similar to error signal 502, $V_{OUT}$ signal 504, $D_{PID}$ signal 506, $D_{REAL}$ signal 508, and $V_{IN}$ signal 510, as described in FIG. 11. Error signal 522 represents the error calculated over time by PID 104 between a digital feedback voltage level corresponding to $V_{OUT}$ signal 524 and a desired voltage level. In some examples, $V_{OUT}$ signal 524 may represent the output voltage over time from power converter 4 when power converter 4 is a boost converter with a feedforward circuit. In other examples, $V_{OUT}$ signal 524 may represent the output voltage over time from filter 6 over link 14 when power converter 4 is a boost converter with a feedforward circuit. $D_{PID}$ signal 526 represents the determined digital duty cycle value over time by PID 104 to achieve the desired voltage level at the output of power converter 4. $D_{REAL}$ signal 528 represents the actual duty cycle over time to achieve the desired voltage level at the output of power converter 4. $V_{IN}$ signal 530 represents the analog input voltage of power source 2 over time.

As illustrated by $V_{IN}$ signal 530 and $V_{OUT}$ signal 524 of FIG. 12, increases in the analog input voltage level of power source 2 may cause spikes in the output voltage, however, the spikes may be significant reduced when compared to FIG. 11. For example, an eight volt (V) increase in the analog input voltage level of power source 2 may no longer cause a sixteen volt increase in the output voltage, but instead may cause only a five volt increase. Additionally, as illustrated by $D_{PID}$ signal 526 and $D_{REAL}$ signal 528 of FIG. 12, when power converter 4 has a feedforward circuit in accordance with the techniques described herein, PID 104 determines the digital duty cycle value based on the output voltage because the feedforward circuit already compensates for changes in the analog input voltage level of power source 2. In this way, the digital duty cycle value determined by PID 104 after reaching a steady state is substantially constant as illustrated by $D_{PID}$ signal 526 when compared to $D_{PID}$ signal 506 of FIG. 11. In some examples, PID 104 may require significantly less processing to determine the digital duty cycle value because of the feedforward circuit, which may increase efficiency and decrease the amount of power required by PID 104 to operate, among other advantages including a reduction in the line step response.

Additionally, in some examples, the feedforward circuit may provide faster compensation to the actual duty cycle based on changes in the analog input voltage level of power source 2 as illustrated by $D_{REAL}$ signal 528 when compared to $D_{REAL}$ signal 508 of FIG. 11. For example, $D_{REAL}$ signal 528 may be able to achieve steady state at about 0.5 milliseconds (ms), which directly corresponds to the amount of time that the analog input voltage level took to achieve a steady state (e.g., 0.5 ms). Comparatively, for example, $D_{REAL}$ signal 508 may not be able to achieve a steady state after there are changes to the analog input voltage level as illustrated in FIG. 11.

Figure 13:
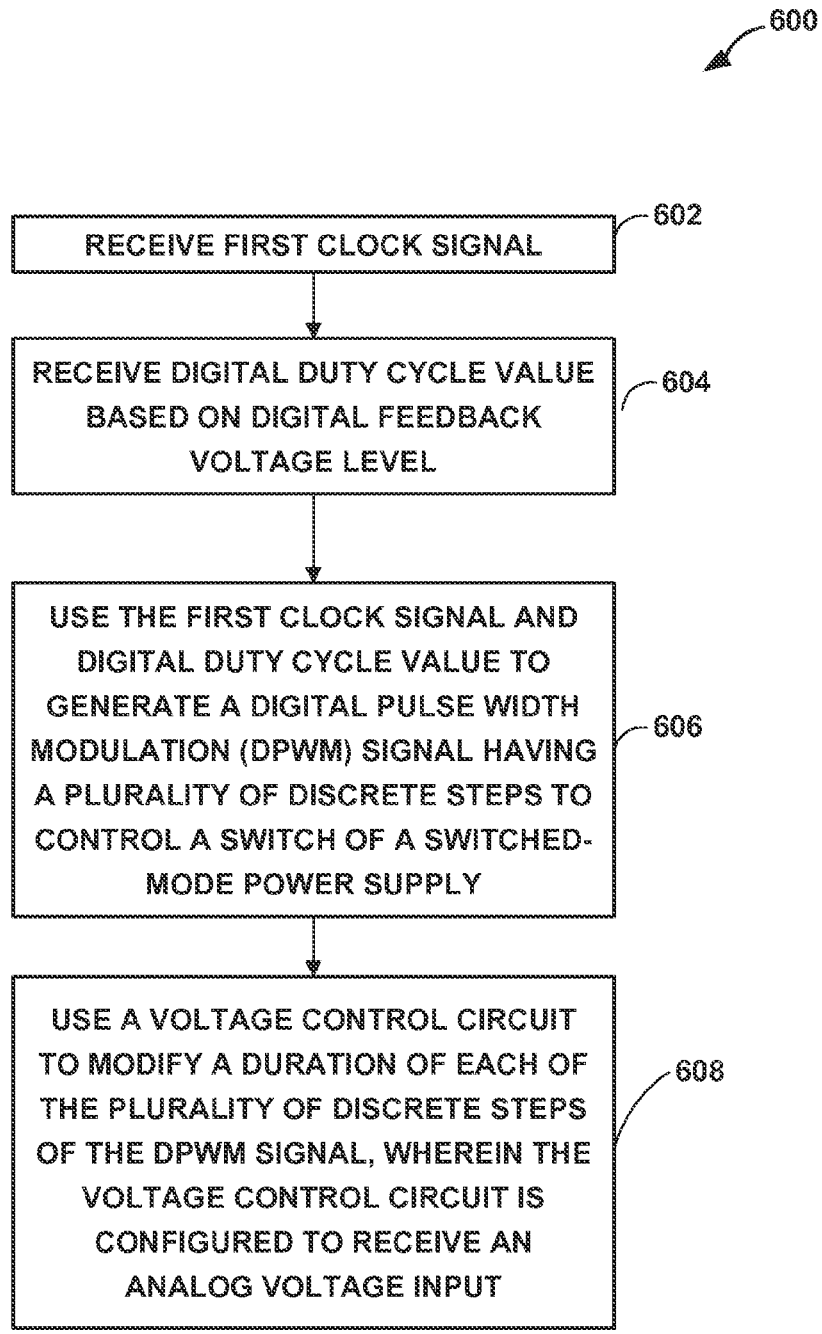
FIG. 13 is a flow chart illustrating an example technique of feedforward control, in accordance with the examples of this disclosure.

FIG. 13 is a flow chart illustrating example technique 600 of feedforward control, in accordance with the examples of this disclosure. FIG. 13 is described with reference to FIGS. 1 and 2; however, FIG. 13 may also be applicable to FIGS. 4 and 6. For example, digital pulse width modulator 106 may use a voltage control circuit to modify a duration of each of the plurality of discrete steps of the DPWM signal, wherein the voltage control circuit is configured to receive an analog voltage input (608). In some examples, digital pulse width modulator 106 may receive a clock signal from a voltage controlled oscillator, and the frequency of the clock signal may depend on the analog input voltage level.

In some examples, digital pulse width modulator 106 may modify a duration of each of the plurality of discrete steps of the DPWM signal by counting each of the plurality of discrete steps of the DPWM signal; setting the DPWM signal based on a first clock edge of the first clock signal; clearing the DPWM signal when the count of each of the plurality of discrete steps of the DPWM signal is equal to the digital duty cycle value; and clearing the count of the plurality of discrete steps of the DPWM signal based on a second edge of the first clock signal.

In some examples, digital pulse width modulator 106 may modify the duration of each of the plurality of discrete steps of the DPWM signal by counting each of the plurality of discrete steps of the DPWM signal; setting the DPWM signal in response to receiving a first clock edge of the first clock signal; clearing the count of the plurality of discrete steps of the DPWM signal in response to receiving a second edge of the first clock signal; triggering a delay line in response to the count of the plurality of discrete steps of the DPWM signal equaling a value of a plurality of most significant bits of the digital duty cycle value; and clearing the DPWM signal in response to triggering the delay line; wherein a duration of the delay line is determined by a number of delay elements corresponding to a plurality of least significant bits of the digital duty cycle value.

In some examples, digital pulse width modulator 106 may modify the duration of each of the plurality of discrete steps of the DPWM signal by setting the DPWM signal in response to receiving a first clock edge of the first clock signal; triggering a delay line; and clearing the DPWM signal in response to triggering the delay line; wherein a duration of the delay line is determined by a number of delay elements corresponding to a value of the digital duty cycle value.

In some examples, digital pulse width modulator 106 may receive a first clock signal (602). In some examples, digital pulse width modulator 106 may receive a digital duty cycle value based on a digital feedback voltage level (604). In some examples, digital pulse width modulator 106 may use the first clock signal and digital duty cycle value to generate a digital pulse width modulation (DPWM) signal having a plurality of discrete steps to control a switch of a switched-mode power supply (606). In some examples, digital pulse width modulator 106 may use a voltage control circuit to modify a duration of each of the plurality of discrete steps of the DPWM signal, wherein the voltage control circuit is configured to receive an analog voltage input.

The following examples may illustrate one or more aspects of the disclosure.

Example 1

A method for controlling a DC-DC power converter comprising: receiving a first clock signal; receiving a digital duty cycle value; using the first clock signal and digital duty cycle value to generate a digital pulse width modulation (DPWM) signal having a plurality of discrete steps to control a switch of a switched-mode power supply; and using a voltage control circuit to modify a duration of each of the plurality of discrete steps of the DPWM signal, wherein the voltage control circuit is configured to receive an analog voltage input.

Example 2

The method of example 1, wherein the voltage control circuit comprises a variable delay line configured to select the duration of each of the plurality of discrete steps of the DPWM signal.

Example 3

The method of any combination of examples 1-2, further comprising modifying the duration of each of the plurality of discrete steps of the DPWM signal by modifying a duration of the variable delay line.

Example 4

The method of any combination of examples 1-3, wherein a voltage controlled oscillator generates the first clock signal, and wherein a frequency of the voltage controlled oscillator depends on the voltage control circuit.

Example 5

The method of any combination of examples 1-4, wherein using the voltage control circuit to modify the duration of each of the plurality of discrete steps of the DPWM signal comprises: counting each of the plurality of discrete steps of the DPWM signal; setting the DPWM signal based on a first clock edge of the first clock signal; clearing the DPWM signal when the count of each of the plurality of discrete steps of the DPWM signal is equal to the digital duty cycle value; and clearing the count of the plurality of discrete steps of the DPWM signal based on a second edge of the first clock signal.

Example 6

The method of any combination of examples 1-5, wherein using the voltage control circuit to modify the duration of each of the plurality of discrete steps of the DPWM signal comprises: counting each of the plurality of discrete steps of the DPWM signal; responsive to receiving a first clock edge of the first clock signal, setting the DPWM signal; responsive to receiving a second edge of the first clock signal, clearing the count of the plurality of discrete steps of the DPWM signal; responsive to the count of the plurality of discrete steps of the DPWM signal equaling a value of a plurality of most significant bits of the digital duty cycle value, triggering a delay line; and responsive to triggering the delay line, clearing the DPWM signal; wherein a duration of the delay line is determined by a number of delay elements corresponding to a plurality of least significant bits of the digital duty cycle value.

Example 7

The method of any combination of examples 1-6, wherein using the voltage control circuit to modify the duration of each of the plurality of discrete steps of the DPWM signal comprises: responsive to receiving a first clock edge of the first clock signal, setting the DPWM signal; triggering a delay line; and responsive to triggering the delay line, clearing the DPWM signal; wherein a duration of the delay line is determined by a number of delay elements corresponding to a value of the digital duty cycle value.

Example 8

The method of any combination of examples 1-7, wherein using an voltage control circuit to modify a duration of each of the plurality of discrete steps of the DPWM signal comprises: generating a reference current as a function of the voltage control circuit; setting the DPWM signal based on a first clock edge of the first clock signal; and delaying a clear of the DPWM signal based on the digital duty cycle value and the reference current.

Example 9

The method of any combination of examples 1-8, wherein generating a reference current as a function of the voltage control circuit comprises: generating a voltage by comparing an output from a delay line to a calibration clock; increasing the voltage from a phase detector; generating a reference voltage by adding together the increased voltage of the phase detector and the voltage control circuit; filtering the reference voltage; and converting the reference voltage to the reference current.

Example 10

A switched-mode power supply device comprising: a switch; an analog-to-digital converter (ADC) configured to: receive a feedback voltage level, and output a digital feedback voltage level; a controller configured to: receive the digital feedback voltage level, determine a digital duty cycle value based on the digital feedback voltage level, and output the digital duty cycle value; and a digital pulse width modulator comprising at least one feedforward component configured to modify a duration of each of a plurality of discrete steps of a digital pulse width modulation (DPWM) signal based on a voltage control circuit, wherein the digital pulse width modulator is configured to: receive a first clock signal and the digital duty cycle value, and generate the DPWM signal to control the switch, and wherein the voltage control circuit is configured to receive an analog voltage input.

Example 11

The device of example 10, wherein the voltage control circuit comprises a voltage controlled oscillator connected between an analog power source and the at least one feedforward component, wherein the voltage controlled oscillator is configured to generate the first clock signal and provide the first clock signal to the at least one feedforward component, wherein a frequency of the voltage controlled oscillator is a function of a voltage of the analog power source.

Example 12

The device of any combination of examples 10-11, wherein the at least one feedforward component comprises: a counter configured to start a count of each of the plurality of discrete steps of the DPWM signal and set the DPWM signal upon receiving a first clock edge of the first clock signal, and wherein the counter is configured to clear the count upon receiving a second edge of the first clock signal; and a comparator configured to clear the DPWM signal when the digital duty cycle value is equal to the count of the counter.

Example 13

The device of any combination of examples 10-12, wherein the at least one feedforward component comprises: a counter configured to start a count of each of the plurality of discrete steps of the DPWM signal and set the DPWM signal upon receiving a first clock edge of the first clock signal, and wherein the counter is configured to clear the count upon receiving a second edge of the first clock signal; a delay line configured to clear the DPWM signal, wherein a duration of the delay line is determined by a number of delay elements corresponding to a plurality of least significant bits of the digital duty cycle value; and a comparator configured to trigger the delay line when a plurality of most significant bits of the digital duty cycle value are equal to the count of the counter.

Example 14

The device of any combination of examples 10-13, wherein the at least one feedforward component is configured to set the DPWM signal upon receiving a first clock edge of the first clock signal, and wherein the at least one feedforward component comprises a delay line configured to clear the DPWM signal, wherein a duration of the delay line is determined by a number of delay elements corresponding to the digital duty cycle value.

Example 15

The device of any combination of examples 10-14, wherein the voltage control circuit comprises a voltage control loop comprising: a phase detector configured to generate a voltage by comparing an output from the delay line to a calibration clock; a charge pump configured to increase the voltage from the phase detector; a summing node configured to generate a reference voltage by adding together the voltage from the charge pump and a voltage level of the analog power source; a loop filter configured to filter the reference voltage and stabilize the loop with the delay line; and a voltage-to-current converter configured to convert the reference voltage to the reference current and provide the reference current to the delay elements of the delay line.

Example 16

The device of any combination of examples 10-15, wherein each of the delay elements of the delay line comprises a current-starved inverter.

Example 17

The device of examples 10-16, wherein the digital duty cycle value remains substantially constant compared to a duty cycle of the DPWM signal.

Example 18

A system for controlling a DC-DC power converter comprising: means for modifying a duration of each of a plurality of discrete steps of a digital pulse width modulation (DPWM) signal based on a voltage control circuit, wherein the voltage control circuit is configured to receive an analog voltage input; means for receiving a first clock signal; means for receiving a digital duty cycle value based on a digital feedback voltage level; and means for generating the DPWM signal based on the first clock signal and the digital duty cycle value to control a switch of a switched-mode power supply.

Example 19

The system of example 18, wherein means for receiving a first clock signal comprises means for receiving the first clock signal from a voltage controlled oscillator, wherein a frequency of the first clock signal depends on the voltage control circuit.

Example 20

The system of any combination of examples 18-19, wherein the means for modifying a duration of each of a plurality of discrete steps of a digital pulse width modulation (DPWM) signal based on an voltage control circuit comprises: means for counting each of the plurality of discrete steps of the DPWM signal; means for setting the DPWM signal based on a first clock edge of the first clock signal; means for clearing the DPWM signal when the count of each of the plurality of discrete steps of the DPWM signal is equal to the digital duty cycle value; and means for clearing the count of the plurality of discrete steps of the DPWM signal based on a second edge of the first clock signal.

Example 21

The system of any combination of examples 18-20, wherein the means for modifying a duration of each of a plurality of discrete steps of a digital pulse width modulation (DPWM) signal based on an voltage control circuit comprises: means for counting each of the plurality of discrete steps of the DPWM signal; means for setting the DPWM signal in response to receiving a first clock edge of the first clock signal; means for clearing the count of the plurality of discrete steps of the DPWM signal in response to receiving a second edge of the first clock signal; means for triggering a delay line in response to the count of the plurality of discrete steps of the DPWM signal equaling a value of a plurality of most significant bits of the digital duty cycle value; and means for clearing the DPWM signal in response to triggering the delay line; wherein a duration of the delay line is determined by a number of delay elements corresponding to a plurality of least significant bits of the digital duty cycle value.

Example 22

The system of any combination of examples 18-21, wherein the means for modifying a duration of each of a plurality of discrete steps of a digital pulse width modulation (DPWM) signal based on an voltage control circuit comprises: means for setting the DPWM signal in response to receiving a first clock edge of the first clock signal; means for triggering a delay line; and means for clearing the DPWM signal in response to triggering the delay line; wherein a duration of the delay line is determined by a number of delay elements corresponding to a value of the digital duty cycle value.

In one or more examples, the functions described may be implemented in hardware, software, firmware, or any combination thereof. If implemented in software, the functions may be stored on, as one or more instructions or code, a computer-readable medium and executed by a hardware-based processing unit (e.g., counter 112 of digital pulse width modulator 106 or PID 104). Computer-readable media may include computer-readable storage media, which corresponds to a tangible medium such as data storage media. In this manner, computer-readable media generally may correspond to tangible computer-readable storage media which is non-transitory. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. It should be understood that computer-readable storage media and data storage media do not include carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors (e.g., counter 112 of digital pulse width modulator 106 or PID 104), such as one or more digital signal processors (DSPs), general purpose microprocessors, application specific integrated circuits (ASICs), field programmable logic arrays (FPGAs), or other equivalent integrated or discrete logic circuitry. Accordingly, the term "processor" or "controller" as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including an integrated circuit (IC) or a set of ICs (e.g., a chip set). Various components, units, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

The invention claimed is:

1. A method for controlling a DC-DC power converter comprising:
   receiving, by a digital pulse width modulator for the DC-DC power converter and from at least one feedforward component, a feedforward voltage signal as a first clock signal;
   receiving, by the digital pulse width modulator and from a controller, a digital duty cycle value;
   generating, by the digital pulse width modulator and based on the first clock signal and the digital duty cycle value, a digital pulse width modulation (DPWM) signal having a plurality of discrete steps to control a switch of a switched-mode power supply; and
   modifying, by the digital pulse width modulator, a duration of each of the plurality of discrete steps of the DPWM signal based on the feedforward voltage signal received from the at least one feedforward component, wherein the at least one feedforward component is configured to receive an analog voltage output of a power source.

2. The method of claim 1, wherein the at least one feedforward component comprises a variable delay line configured to modify the duration of each of the plurality of discrete steps of the DPWM signal.

3. The method of claim 2, further comprising modifying the duration of each of the plurality of discrete steps of the DPWM signal by modifying a duration of the variable delay line.

4. The method of claim 1, wherein the at least one feedforward component comprises a voltage controlled oscillator that generates the first clock signal, and wherein a frequency of the voltage controlled oscillator depends on the analog voltage output of the power source.

5. The method of claim 4, wherein modifying the duration of each of the plurality of discrete steps of the DPWM signal comprises:
   counting each of the plurality of discrete steps of the DPWM signal;
   setting the DPWM signal based on a first clock edge of the first clock signal;
   clearing the DPWM signal when the count of each of the plurality of discrete steps of the DPWM signal is equal to the digital duty cycle value; and
   clearing the count of the plurality of discrete steps of the DPWM signal based on a second edge of the first clock signal.

6. The method of claim 4, wherein modifying the duration of each of the plurality of discrete steps of the DPWM signal comprises:
   counting each of the plurality of discrete steps of the DPWM signal;
   responsive to receiving a first clock edge of the first clock signal, setting the DPWM signal;
   responsive to receiving a second edge of the first clock signal, clearing the count of the plurality of discrete steps of the DPWM signal;
   responsive to the count of the plurality of discrete steps of the DPWM signal equaling a value of a plurality of most significant bits of the digital duty cycle value, triggering a delay line; and
   responsive to triggering the delay line, clearing the DPWM signal;
   wherein a duration of the delay line is determined by a number of delay elements corresponding to a plurality of least significant bits of the digital duty cycle value.

7. The method of claim 1, wherein modifying the duration of each of the plurality of discrete steps of the DPWM signal comprises:
   responsive to receiving a first clock edge of the first clock signal, setting the DPWM signal;
   triggering a delay line; and
   responsive to triggering the delay line, clearing the DPWM signal;
   wherein a duration of the delay line is determined by a number of delay elements corresponding to a value of the digital duty cycle value.

8. The method of claim 1, wherein modifying the duration of each of the plurality of discrete steps of the DPWM signal comprises:
   generating a reference current as a function of the at least one feedforward component;
   setting the DPWM signal based on a first clock edge of the first clock signal; and
   delaying a clear of the DPWM signal based on the digital duty cycle value and the reference current.

9. The method of claim 8, wherein generating the reference current as the function of the at least one feedforward component comprises:
   generating a voltage by comparing an output from a delay line to a calibration clock;
   increasing the voltage from a phase detector;
   generating a reference voltage by adding together the increased voltage of the phase detector and the at least one feedforward component;
   filtering the reference voltage; and
   converting the reference voltage to the reference current.

10. A switched-mode power supply device comprising:
    a switch;
    an analog-to-digital converter configured to:
       receive a feedback voltage level, and
       output a digital feedback voltage level;
    a controller configured to:
       receive the digital feedback voltage level,
       determine a digital duty cycle value based on the digital feedback voltage level, and
       output the digital duty cycle value; and
    a digital pulse width modulator configured to modify a duration of each of a plurality of discrete steps of a digital pulse width modulation (DPWM) signal based on a feedforward voltage signal received from at least one feedforward component, wherein the digital pulse width modulator is configured to:
       receive, from the at least one feedforward component, the feedforward voltage signal as a first clock signal;
       receive, from the controller, the digital duty cycle value, and
       generate, based on the first clock signal and the digital duty cycle value, the DPWM signal to control the switch, and
    wherein the at least one feedforward component is configured to receive an analog voltage output of a power source.

11. The device of claim 10, wherein the at least one feedforward component comprises a voltage controlled oscillator connected between the analog voltage output of the power source and the digital pulse width modulator, wherein the voltage controlled oscillator is configured to generate the first clock signal and provide the first clock signal to the digital pulse width modulator, wherein a frequency of the voltage controlled oscillator is a function of the analog voltage of the power source.

12. The device of claim 11, wherein the at least one feedforward component comprises:
    a counter configured to start a count of each of the plurality of discrete steps of the DPWM signal and set the DPWM signal upon receiving a first clock edge of the first clock signal, and wherein the counter is configured to clear the count upon receiving a second edge of the first clock signal; and
    a comparator configured to clear the DPWM signal when the digital duty cycle value is equal to the count of the counter.

13. The device of claim 11, wherein the at least one feedforward component comprises:
    a counter configured to start a count of each of the plurality of discrete steps of the DPWM signal and set the DPWM signal upon receiving a first clock edge of the first clock signal, and wherein the counter is configured to clear the count upon receiving a second edge of the first clock signal;
    a delay line configured to clear the DPWM signal, wherein a duration of the delay line is determined by a number of delay elements corresponding to a plurality of least significant bits of the digital duty cycle value; and
    a comparator configured to trigger the delay line when a plurality of most significant bits of the digital duty cycle value are equal to the count of the counter.

14. The device of claim 11, wherein the at least one feedforward component is configured to set the DPWM signal upon receiving a first clock edge of the first clock signal, and wherein the at least one feedforward component comprises a delay line configured to clear the DPWM signal, wherein a duration of the delay line is determined by a number of delay elements corresponding to the digital duty cycle value.

15. The device of claim 14, wherein at least one feedforward component comprises a voltage control loop comprising:
    a phase detector configured to generate a voltage by comparing an output from the delay line to a calibration clock;
    a charge pump configured to increase the voltage from the phase detector;
    a summing node configured to generate a reference voltage by adding together the voltage from the charge pump and the analog voltage output of the power source;

a loop filter configured to filter the reference voltage and stabilize the loop with the delay line; and a voltage-to-current converter configured to convert the reference voltage to the reference current and provide the reference current to the delay elements of the delay line.

16. The device of claim 15, wherein each of the delay elements of the delay line comprises a current-starved inverter.

17. The device of claim 10, wherein the digital duty cycle value remains substantially constant compared to a duty cycle of the DPWM signal.

18. A system for controlling a DC-DC power converter comprising:

means for modifying a duration of each of a plurality of discrete steps of a digital pulse width modulation (DPWM) signal based on a feedforward voltage signal received from at least one feedforward component, wherein the at least one feedforward component is configured to receive an analog voltage output of a power source;

means for receiving the feedforward voltage signal as a first clock signal;

means for receiving a digital duty cycle value based on a digital feedback voltage level; and means for generating the DPWM signal based on the first clock signal and the digital duty cycle value to control a switch of a switched-mode power supply.

19. The system of claim 18, wherein the at least one feedforward component comprises a voltage controlled oscillator that generates the first clock signal, and wherein a frequency of the first clock signal depends on the analog voltage output of the power source.

20. The system of claim 19, wherein the means for modifying the duration of each of the plurality of discrete steps of the DPWM signal based on the feedforward voltage signal comprises:

means for counting each of the plurality of discrete steps of the DPWM signal;

means for setting the DPWM signal based on a first clock edge of the first clock signal;

means for clearing the DPWM signal when the count of each of the plurality of discrete steps of the DPWM signal is equal to the digital duty cycle value; and means for clearing the count of the plurality of discrete steps of the DPWM signal based on a second edge of the first clock signal.

21. The system of claim 19, wherein the means for modifying the duration of each of the plurality of discrete steps of the DPWM signal based on the feedforward voltage signal comprises:

means for counting each of the plurality of discrete steps of the DPWM signal;

means for setting the DPWM signal in response to receiving a first clock edge of the first clock signal;

means for clearing the count of the plurality of discrete steps of the DPWM signal in response to receiving a second edge of the first clock signal;

means for triggering a delay line in response to the count of the plurality of discrete steps of the DPWM signal equaling a value of a plurality of most significant bits of the digital duty cycle value; and means for clearing the DPWM signal in response to triggering the delay line;

wherein a duration of the delay line is determined by a number of delay elements corresponding to a plurality of least significant bits of the digital duty cycle value.

22. The system of claim 18, wherein the means for modifying the duration of each of the plurality of discrete steps of the DPWM signal based on the feedforward voltage signal comprises:

means for setting the DPWM signal in response to receiving a first clock edge of the first clock signal;

means for triggering a delay line; and means for clearing the DPWM signal in response to triggering the delay line;

wherein a duration of the delay line is determined by a number of delay elements corresponding to a value of the digital duty cycle value.

* * * * *